(12) United States Patent
Subramanian et al.

(10) Patent No.: US 11,705,453 B2
(45) Date of Patent: Jul. 18, 2023

(54) SELF-ALIGNED GATE ENDCAP (SAGE) ARCHITECTURE HAVING LOCAL INTERCONNECTS

(71) Applicant: Intel Corporation, Santa Clara, CA (US)

(72) Inventors: Sairam Subramanian, Portland, OR (US); Walid M. Hafez, Portland, OR (US); Sridhar Govindaraju, Portland, OR (US); Kiran Chikkadi, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 984 days.

(21) Appl. No.: 16/294,380

(22) Filed: Mar. 6, 2019

(65) Prior Publication Data

US 2020/0286891 A1  Sep. 10, 2020

(51) Int. Cl.
*H01L 27/092* (2006.01)
*H01L 29/78* (2006.01)
*H01L 29/66* (2006.01)
*H01L 21/8238* (2006.01)
*H01L 23/528* (2006.01)
*H01L 21/768* (2006.01)
(Continued)

(52) U.S. Cl.
CPC ...... *H01L 27/0924* (2013.01); *H01L 21/3086* (2013.01); *H01L 21/3088* (2013.01); *H01L 21/76895* (2013.01); *H01L 21/823821* (2013.01); *H01L 21/823828* (2013.01); *H01L 21/823871* (2013.01); *H01L 21/823878* (2013.01); *H01L 23/5283* (2013.01); *H01L 24/09* (2013.01); *H01L 24/17* (2013.01); *H01L 29/66545* (2013.01); *H01L 29/66553* (2013.01); *H01L 29/785* (2013.01)

(58) Field of Classification Search
CPC ....... H01L 21/76895; H01L 21/823821; H01L 21/823871; H01L 21/823481; H01L 21/823878; H01L 27/0924; H01L 29/785
See application file for complete search history.

(56) References Cited

U.S. PATENT DOCUMENTS

2016/0379893 A1* 12/2016 Ok ............... H01L 23/5283
                                                257/369
2017/0018620 A1*  1/2017 Liu ............... H01L 27/092
2017/0154967 A1*  6/2017 Huang ........... H01L 27/0886

FOREIGN PATENT DOCUMENTS

WO     WO-2018063365 A1 *  4/2018  ...... H01L 21/76895

* cited by examiner

*Primary Examiner* — Tuan A Hoang
(74) *Attorney, Agent, or Firm* — Schwabe, Williamson & Wyatt, P.C.

(57) ABSTRACT

Self-aligned gate endcap (SAGE) architectures having local interconnects, and methods of fabricating SAGE architectures having local interconnects, are described. In an example, an integrated circuit structure includes a first gate structure over a first semiconductor fin, and a second gate structure over a second semiconductor fin. A gate endcap isolation structure is between the first and second semiconductor fins and laterally between and in contact with the first and second gate structures. A gate plug is over the gate endcap isolation structure and laterally between and in contact with the first and second gate structures. A local gate interconnect is between the gate plug and the gate endcap isolation structure, the local gate interconnect in contact with the first and second gate structures.

21 Claims, 26 Drawing Sheets

(51) Int. Cl.
*H01L 21/308* (2006.01)
*H01L 23/00* (2006.01)

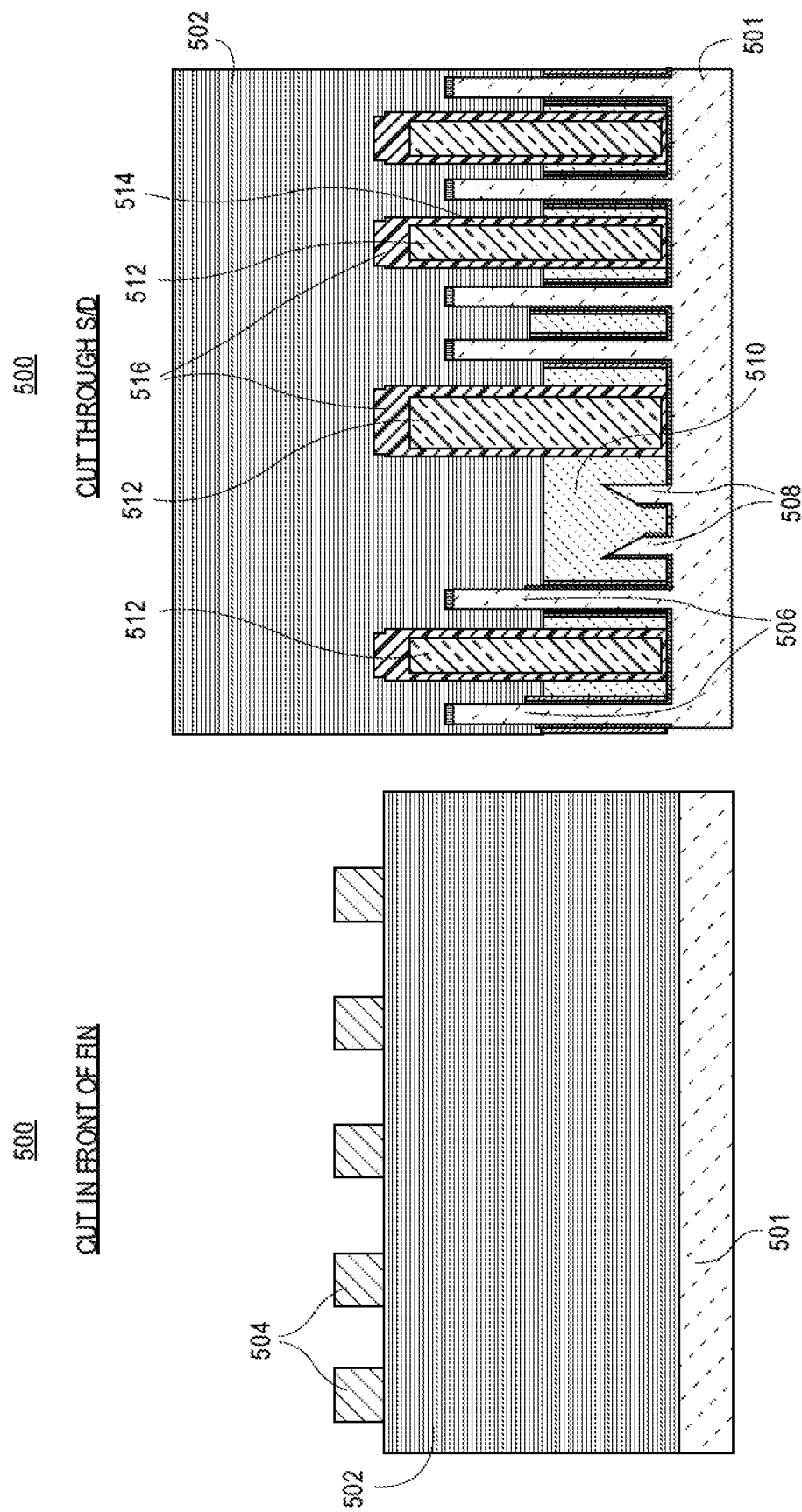

SELF-ALIGNED GATE ENDCAP (SAGE) ARCHITECTURE HAVING LOCAL INTERCONNECTS

TECHNICAL FIELD

Embodiments of the disclosure are in the field of integrated circuit structures and processing and, in particular, self-aligned gate endcap (SAGE) architectures having local interconnects, and methods of fabricating SAGE architectures having local interconnects.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process.

Scaling multi-gate transistors has not been without consequence, however. As the dimensions of these fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features. Additionally, the constraints on including passive features among active devices have increased.

BRIEF DESCRIPTION OF THE DRAWINGS

FIGS. 5A-5J illustrates cross-sectional views representing various operations in a method of fabricating an integrated circuit structure including a self-aligned gate endcap (SAGE) architecture having a local interconnect, in accordance with an embodiment of the present disclosure.

DESCRIPTION OF THE EMBODIMENTS

Figure 1:
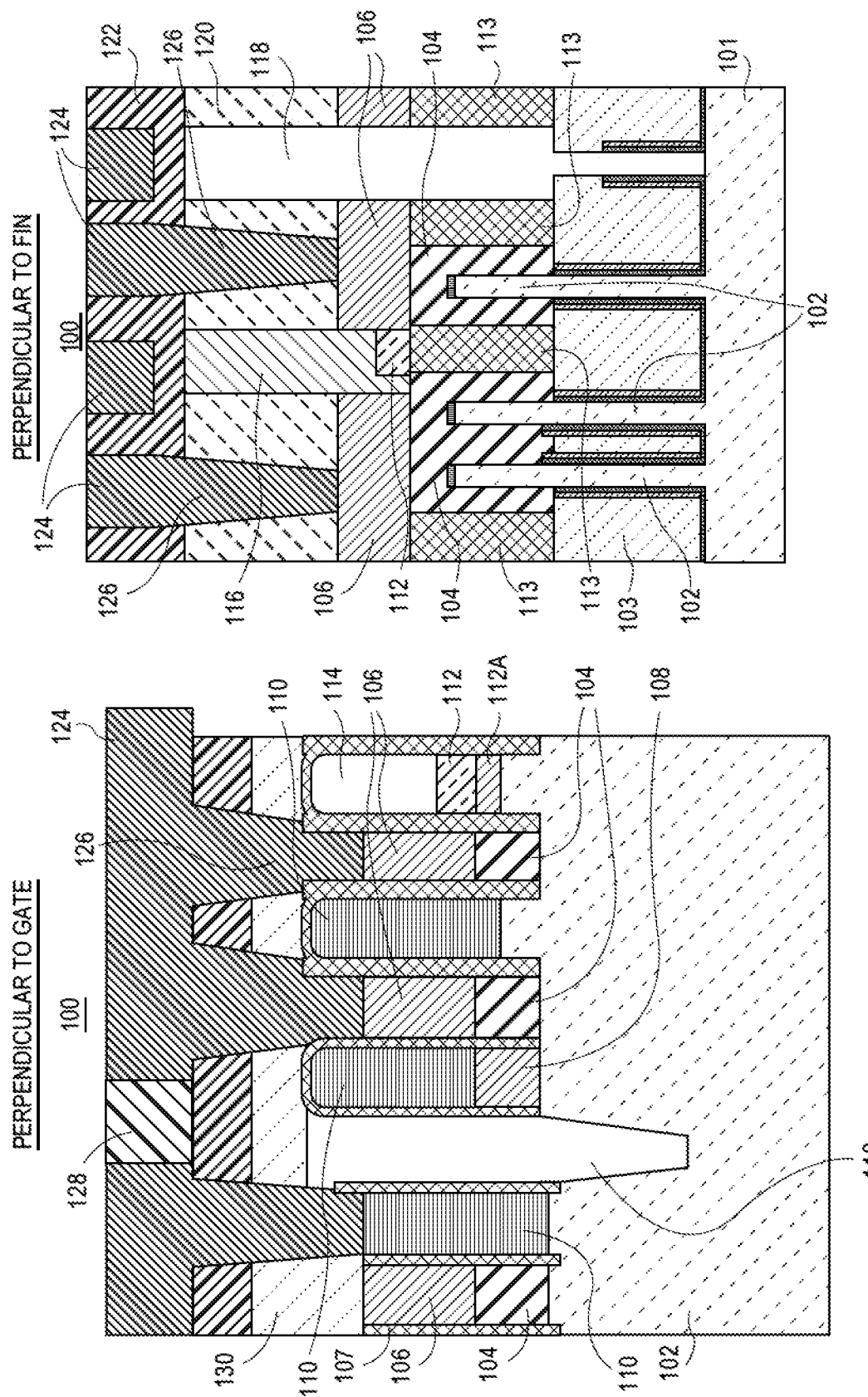
FIG. 1 illustrates cross-sectional views of an integrated circuit structure including a self-aligned gate endcap (SAGE) architecture having a local interconnect.

Self-aligned gate endcap (SAGE) architectures having local interconnects, and methods of fabricating SAGE architectures having local interconnects, are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments of the present disclosure are directed to integrated circuit structures or devices having one or more gate endcap structures (e.g., as gate isolation regions) of gate electrodes of the integrated circuit structures or devices. The gate endcap structures may be self-aligned gate endcap (SAGE) walls formed between and in parallel alignment with a plurality of semiconductor fins. In an embodiment, the fabrication of local interconnects through a SAGE architecture is described. In an embodiment, an architecture for the formation of local gate-gate interconnects through multiple patterned gate etches is described.

To provide context, logic devices are aggressively scaled in dimension, creating fabrication and yield challenges for gate and contact end cap patterning. Today's state of the art processes rely on a self-aligned gate endcap (SAGE) architecture that provides a potential landing spot for a gate or contact plug. Plug patterning involves etching holes into a sacrificial hardmask or other etchable film, and filling the resulting hole with an insulating material. The bulk sacrificial film is then removed prior to metal fill. Local interconnects are created in locations where there are no plugs by fabricating a metal structure that crosses over a SAGE wall in the absence of gate/contact plugs.

With hyper-scaling of logic devices, on chip real estate to route all the interconnects needed for functionality is at a premium, leading to larger footprints which then counter the scaling margin or require addition of more metal layers causing increased capacitance and leading to switching delays and lower frequencies. Embodiments described herein may be implemented to address issues associated with adding additional gate-gate or contact-contact local interconnects in an ultra-scaled process technology.

As a comparative example, FIG. 1 illustrates cross-sectional views of an integrated circuit structure including a self-aligned gate endcap (SAGE) architecture having a local interconnect. A cross-sectional view representing a "Perpendicular to Gate" view is on the left-hand side of FIG. 1, and a cross-sectional view representing a "Perpendicular to Fin" view is on the right-hand side of FIG. 1.

Referring to FIG. 1, an integrated circuit structure 100 includes semiconductor fins 102 protruding from a semiconductor substrate 101 and through a trench isolation region 103. Gate structures over the fins 102 include a gate electrode 104 and a local gate contact 106 on the gate electrode 104. Gate sidewall spacers 107 may also be included. Trench contact structures may include a first contact portion 108 and a second contact portion 110, or only the second contact portion 110, examples of both of which are depicted. A SAGE architecture includes a self-aligned wall (SAW) feature 112 on a SAGE structure 113 or other SAGE feature 112A. A contact plug 114 is on a first portion of the SAW feature 112, and a gate plug 116 is on a second portion of the SAW feature 112. A fin trim isolation structure 118 isolates a fin 102 into two different portions. Gate insulating layers 120 or other dielectric layer 130 may be include over the above described structures. An overlying inter-layer dielectric (ILD) material includes metal lines 124 therein. Ones of the metal lines 124 may have associated conductive vias 126. A single metal line 126 may include a plug 128 therein to isolate two different portions of the single metal line 126.

With reference again to FIG. 1, although not depicted, a local gate to gate interconnect may be fabricated by excluding gate plug 116. Gate to gate interconnection is achieved by effectively joining local gate contact portions 106 with a local gate to gate interconnect that goes over SAW portion 112 and/or SAGE structure 113. The gate plug 116 may be an extension of the SAW portion 112 and/or SAGE structure 113 or may be a separate and distinct feature. In either case, omission of the gate plug 116 allows for local interconnect fabrication. Likewise, omission of the contact plug 114 can allow for local interconnect fabrication of a local contact to contact interconnect.

By contrast to the structure of FIG. 1, in a first aspect, one or more embodiments described herein involve the use of a self-aligned perpendicular grid of an insulating material that runs perpendicular to a gate or contact. An etchable insulating material is embedded in the self-aligned-gate-end (SAGE) grid. The intersection of the grid with a gate or contact will provide all possible locations of interconnects. Patterning schemes are then used to etch away the embedded insulators where interconnects are desired ultimately providing a gate metal or contact metal to "flow" through a SAGE structure.

Figure 2:
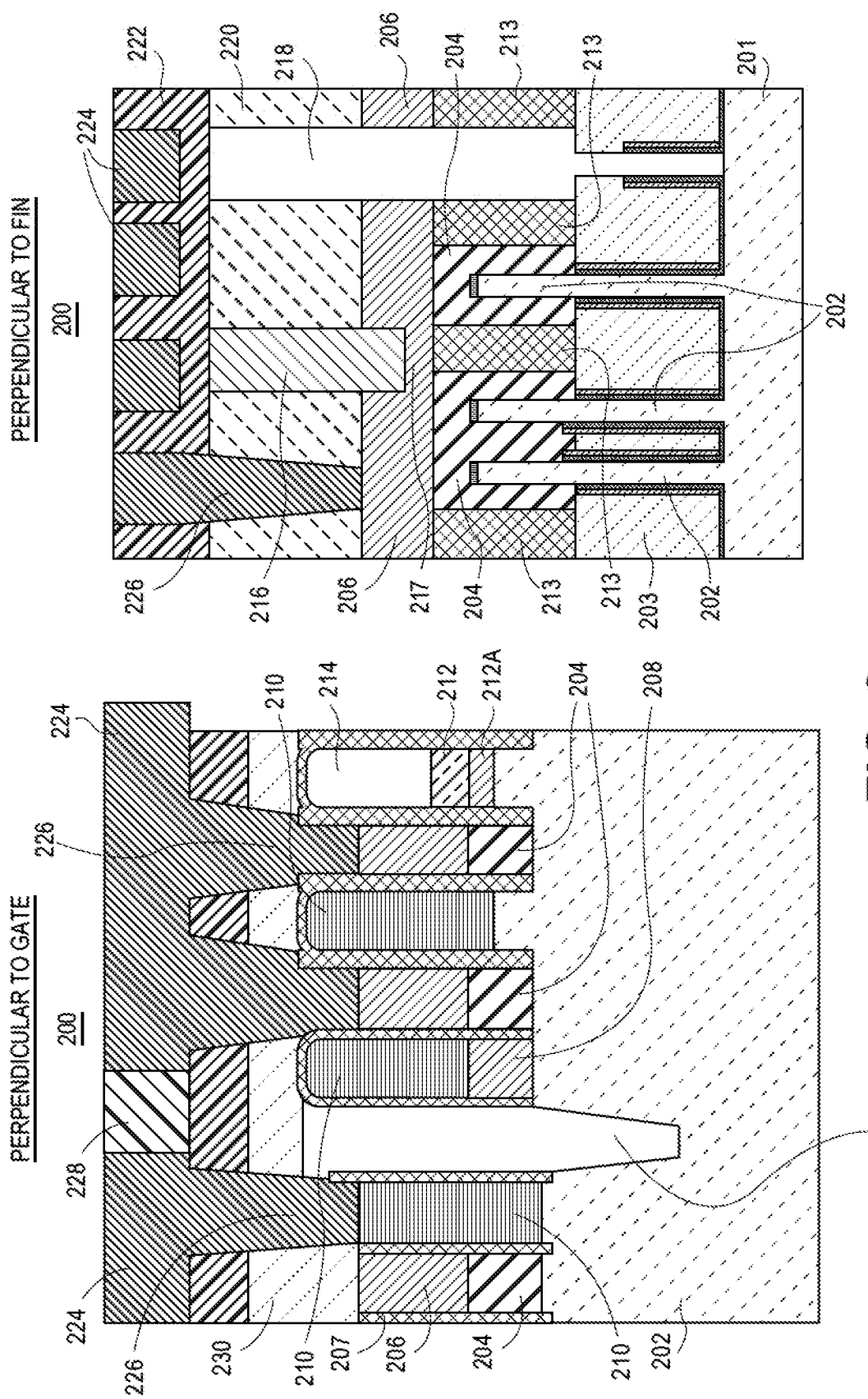
FIG. 2 illustrates cross-sectional views of an integrated circuit structure including a self-aligned gate endcap (SAGE) architecture having a local interconnect, in accordance with an embodiment of the present disclosure.

As an exemplary structure of the first aspect, FIG. 2 illustrates cross-sectional views of an integrated circuit structure including a self-aligned gate endcap (SAGE) architecture having a local interconnect, in accordance with an embodiment of the present disclosure. A cross-sectional view representing a "Perpendicular to Gate" view is on the left-hand side of FIG. 2, and a cross-sectional view representing a "Perpendicular to Fin" view is on the right-hand side of FIG. 2.

Referring to FIG. 2, an integrated circuit structure 200 includes semiconductor fins 202 protruding from a semiconductor substrate 201. Gate structures over the fins 202 include a gate electrode 204 and a local gate contact 206 on the gate electrode 204. Gate sidewall spacers 207 may also be included. Trench contact structures may include a first contact portion 208 and a second contact portion 210, or only the second contact portion 210, examples of both of which are depicted. A SAGE architecture includes a self-aligned wall (SAW) feature 212 on a SAGE structure 213 or other SAGE feature 212A. A contact plug 214 is on a first portion of the SAW feature 212, and a gate plug 216 is on a second portion of the SAW feature 212. A fin trim isolation structure 218 isolates a fin 202 into two different portions. Gate insulating layers 220 or other dielectric layer 230 may be include over the above described structures. An overlying inter-layer dielectric (ILD) material includes metal lines 224 therein. Ones of the metal lines 224 may have associated conductive vias 226. A single metal line 226 may include a plug 228 therein to isolate two different portions of the single metal line 226.

With reference again to FIG. 2, a local gate to gate interconnect 217 is fabricated between gate plug 216 and a SAGE structure 213. Gate to gate interconnection is achieved by effectively joining local gate contact portions 206 with the local gate to gate interconnect 217. It is to be appreciated that gate plug 216 may be an extension of the SAGE structure 213 or may be a separate and distinct feature. In either case, local interconnect fabrication is achieved by effectively forming a conductive feature between a gate plug and a SAGE wall (which can also be referred to as effectively forming a conductive feature through a SAGE wall). Likewise, although not depicted, but would be viewable along a "Cut Through Source/Drain" perspective, a local trench contact to trench contact interconnect may be fabricated between contact plug 214 and a SAGE structure 213.

With reference to the right-hand side of FIG. 2, in accordance with an embodiment of the present disclosure, an integrated circuit structure 200 includes a first gate structure (left 204/206) over a first semiconductor fin 202, and a second gate structure (right 204/206) over a second semiconductor fin 202. A gate endcap isolation structure 213 is between the first and second semiconductor fins 202 and laterally between and in contact with the first (left 204/206) and second (right 204/206) gate structures. A gate plug 216 is over the gate endcap isolation structure 213 and laterally between and in contact with the first (left 204/206) and second (right 204/206) gate structures. A local gate interconnect 217 is between the gate plug 216 and the gate endcap isolation structure 213. The local gate interconnect 217 is in contact with the first (left 204/206) and second gate structures (right 204/206).

In an embodiment, the local gate interconnect 217 is continuous with the first and second gate structures, e.g., continuous with portions 206. In an embodiment, the first (left 204/206) and second (right 204/206) gate structures each include a local gate contact 206, and the local gate interconnect 217 is continuous with the local gate contact 206 of each of the first (left 204/206) and second (right 204/206) gate structures, as is depicted in FIG. 2.

In an embodiment, the gate plug 216 is vertically misaligned with the gate endcap isolation structure 213, as is depicted in FIG. 2. In another embodiment, at least a portion of the gate plug is vertically aligned with the gate endcap isolation structure, as is depicted in the example illustrated in FIG. 3F and described in greater detail below.

In an embodiment, the gate plug 216 has a width greater than a width of the gate endcap isolation structure 213, as is depicted in FIG. 2. In another embodiment, at least a portion of the gate plug has a width the same as a width of the gate endcap isolation structure, as is depicted in the example illustrated in FIG. 3F and described in greater detail below.

In an embodiment, the first and second semiconductor fins 202 protrude through a trench isolation region 203 above substrate 201, as is depicted. The gate endcap isolation structure 213 is on the trench isolation region 203, as is also depicted.

In an embodiment, as is depicted in the example illustrated in FIG. 3G and described in greater detail below, and as would be viewable along a "Cut Through Source/Drain" perspective of an integrated circuit structure such as structure 200, a first trench contact structure is included over the first semiconductor fin, and a second trench contact structure is included over the second semiconductor fin. The gate endcap isolation structure 213 is laterally between and in contact with the first trench contact structure and the second trench contact structure. A trench contact plug 214 is over the gate endcap isolation structure 213 and laterally between and in contact with the first and second trench contact structures. A local trench contact interconnect is between the trench contact plug and the gate endcap isolation structure, the local trench contact interconnect in contact with the first and second trench contact structures. The arrangement for a local trench contact interconnect may appear similar to the arrangement described above for local gate interconnect 217. In one such embodiment, the local trench contact interconnect is continuous with the first and second trench contact structures.

In an embodiment, the trench contact plug is vertically misaligned with the gate endcap isolation structure. In another embodiment, at least a portion of the trench contact plug is vertically aligned with the gate endcap isolation structure.

In an embodiment, the trench contact plug has a width greater than a width of the gate endcap isolation structure. In another embodiment, at least a portion of the trench contact plug has a width the same as a width of the gate endcap isolation structure.

As an exemplary processing scheme for the first aspect, FIGS. 3A-3G illustrates cross-sectional views representing various operations in a method of fabricating an integrated circuit structure including a self-aligned gate endcap (SAGE) architecture having a local interconnect, in accordance with an embodiment of the present disclosure.

Figure 3A:
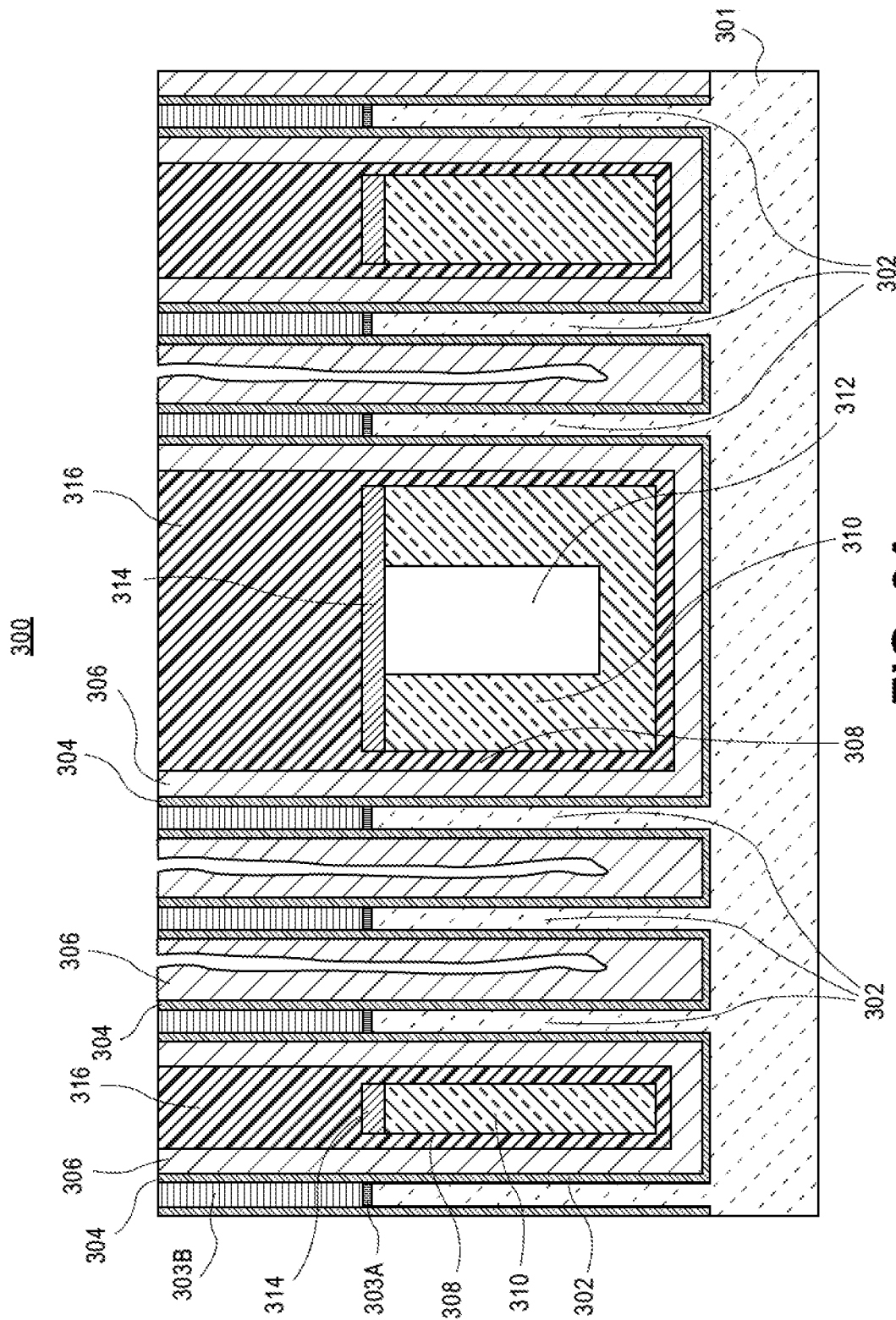
FIGS. 3A-3G illustrates cross-sectional views representing various operations in a method of fabricating an integrated circuit structure including a self-aligned gate endcap (SAGE) architecture having a local interconnect, in accordance with an embodiment of the present disclosure.

Referring to FIG. 3A, a cross-section view taken across a plurality of fins depicted a starting structure 300 including fins 302 protruding from a substrate 301. Fins may have a hardmask 303A thereon, where there hardmask 303A may ultimately be retained or removed during fabrication of a final structure. A sacrificial patterning hardmask 303B is on the hardmask 303A. A self-align wall (SAW) spacer 306 is along the sidewalls and between bottoms of the fins 302. For fins 302 that are not tightly spaced, self-aligned gate endcap (SAGE) structure material(s) are formed within openings of the SAW spacer 306. Relatively narrower SAGE structure materials may include a dielectric liner 308, a dielectric fill 310, an optionally sacrificial cap 314, and a permanent cap 316. Relatively wider SAGE structure materials may further include a second dielectric fill 312. For fins 302 that are tightly spaced, SAGE structure materials may not be formed within openings of the SAW spacer 306, as is depicted.

Figure 3B:
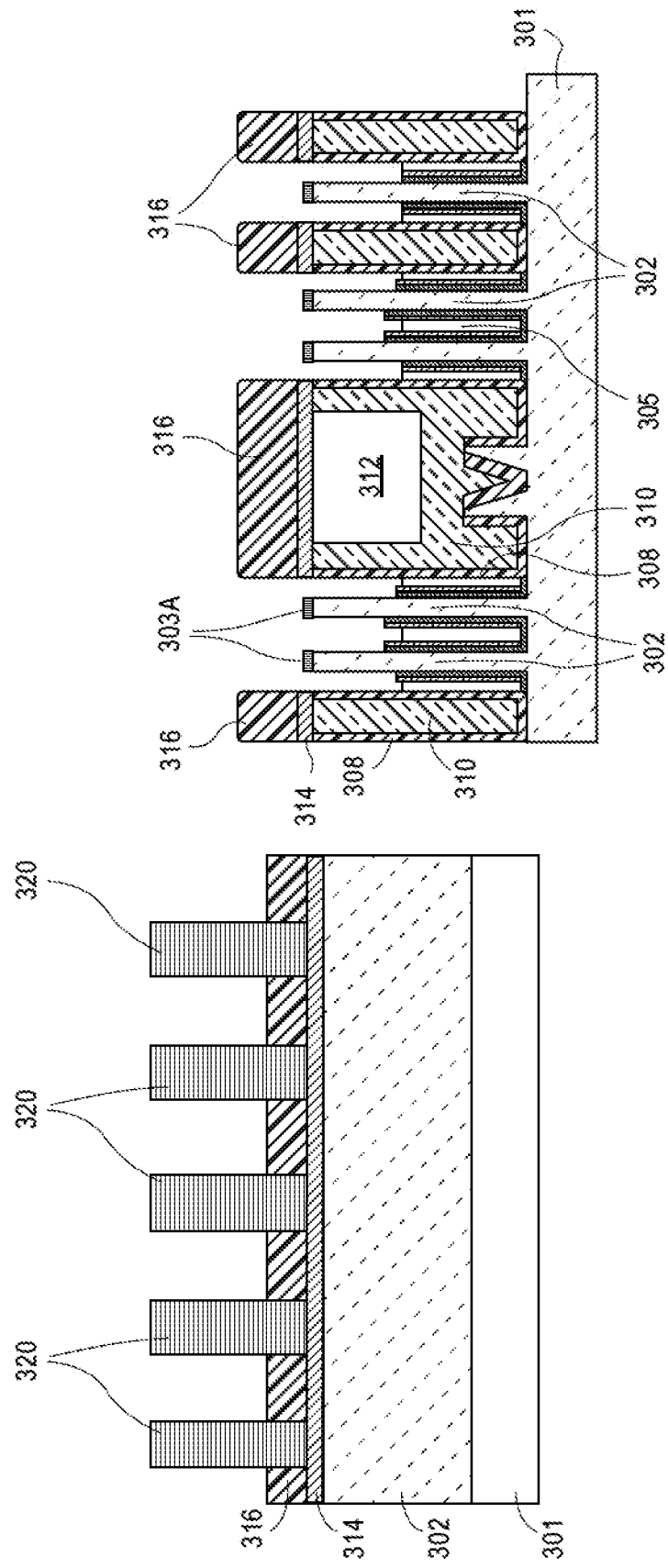

Referring to FIG. 3B, a cross-sectional view representing a "Perpendicular to Gate" view is on the left-hand side, and a cross-sectional view representing a "Perpendicular to Fin" view at source/drain (S/D) is on the right-hand side. At this stage, a plurality of dummy gates 320 have been formed over a fin 302, as depicted on the left-hand side. It is to be appreciated that the arrangement on the left-hand side does not represent a flush cut through the fin but rather shows the structures viewable when observed in a perspective taken along a single fin. As depicted on the right-hand side, SAW spacers 306 have been removed (or mostly removed) from the structure of FIG. 3A. Shallow trench isolation (STI) structures 305 are then formed to adjacent lower fin locations, as is depicted. An additional feature shown is the inclusion of fin "stubs" beneath a relatively larger SAGE structure.

Figure 3C:
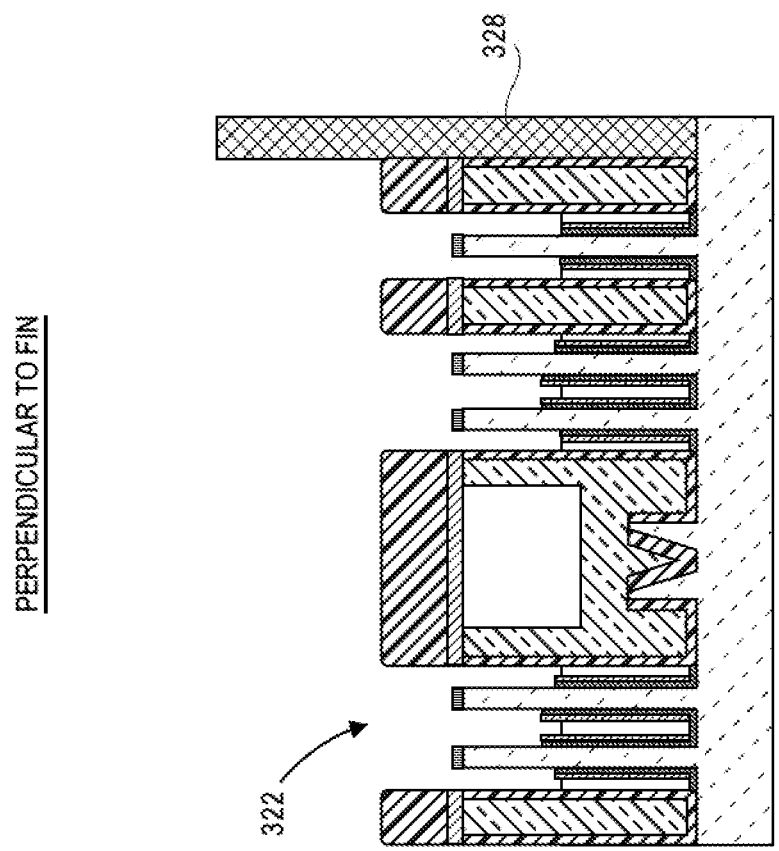
Figure 3C:
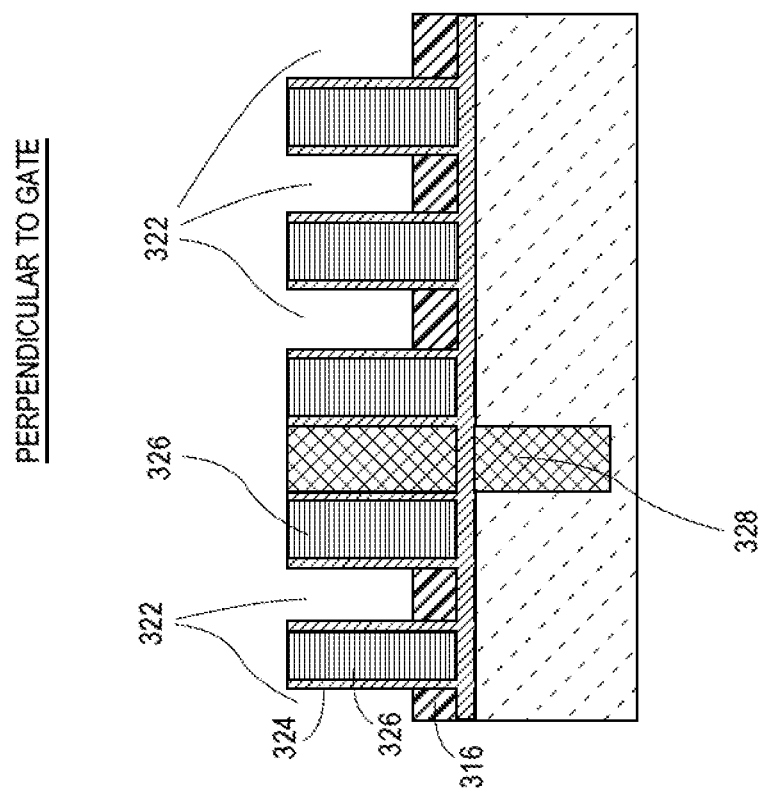

Referring to FIG. 3C, a cross-sectional view representing a "Perpendicular to Gate" view is on the left-hand side, and a cross-sectional view representing a "Perpendicular to Fin"

view is on the right-hand side. At this stage, gate spacers 324 have been formed along sidewalls of the dummy gates 320, interlayer dielectric material 326 subsequently formed between gate spacers 324, and the dummy gates 320 subsequently removed to form gate trenches 322, as depicted on the left-hand side. As depicted on both the left-hand side and the right-hand side, a through-gate isolation or fin trim isolation structure 328 may be formed at locations of select ones of the dummy gate spacers to provide local isolation within a fin 302.

Figure 3D:
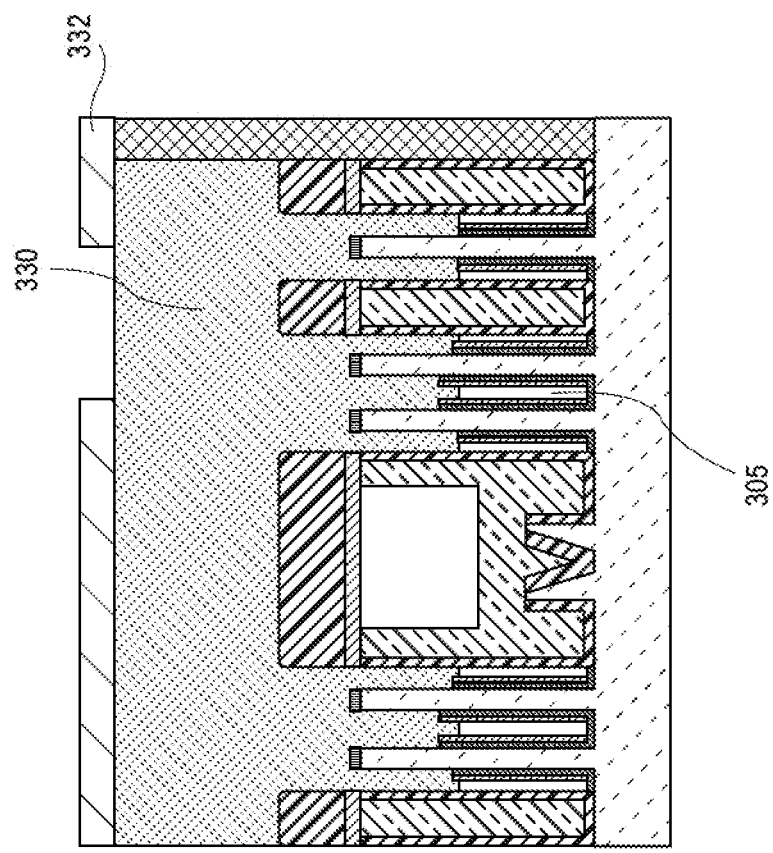
Figure 3D:
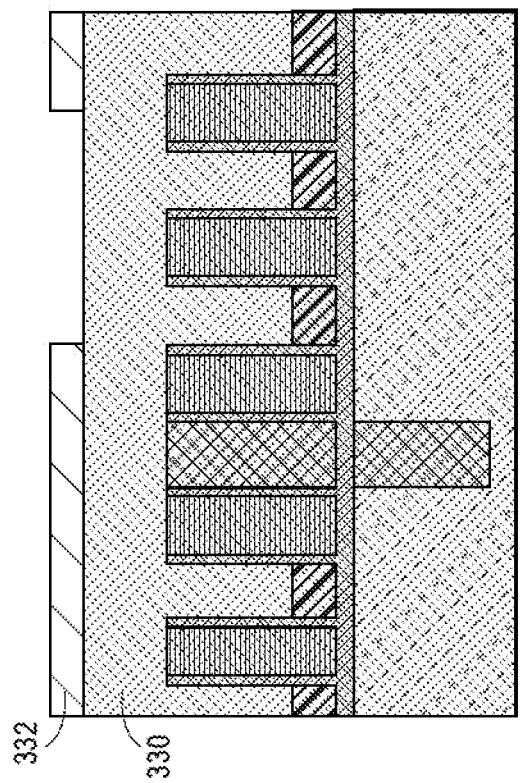

Referring to FIG. 3D, a cross-sectional view representing a "Perpendicular to Gate" view is on the left-hand side, and a cross-sectional view representing a "Perpendicular to Fin" view is on the right-hand side. At this stage, a sacrificial hardmask material 330 and a patterning mask 332 are formed over the structure of FIG. 3C. An opening in the pattern mask 332 is formed in a location where a local interconnect is ultimately formed.

Figure 3E:
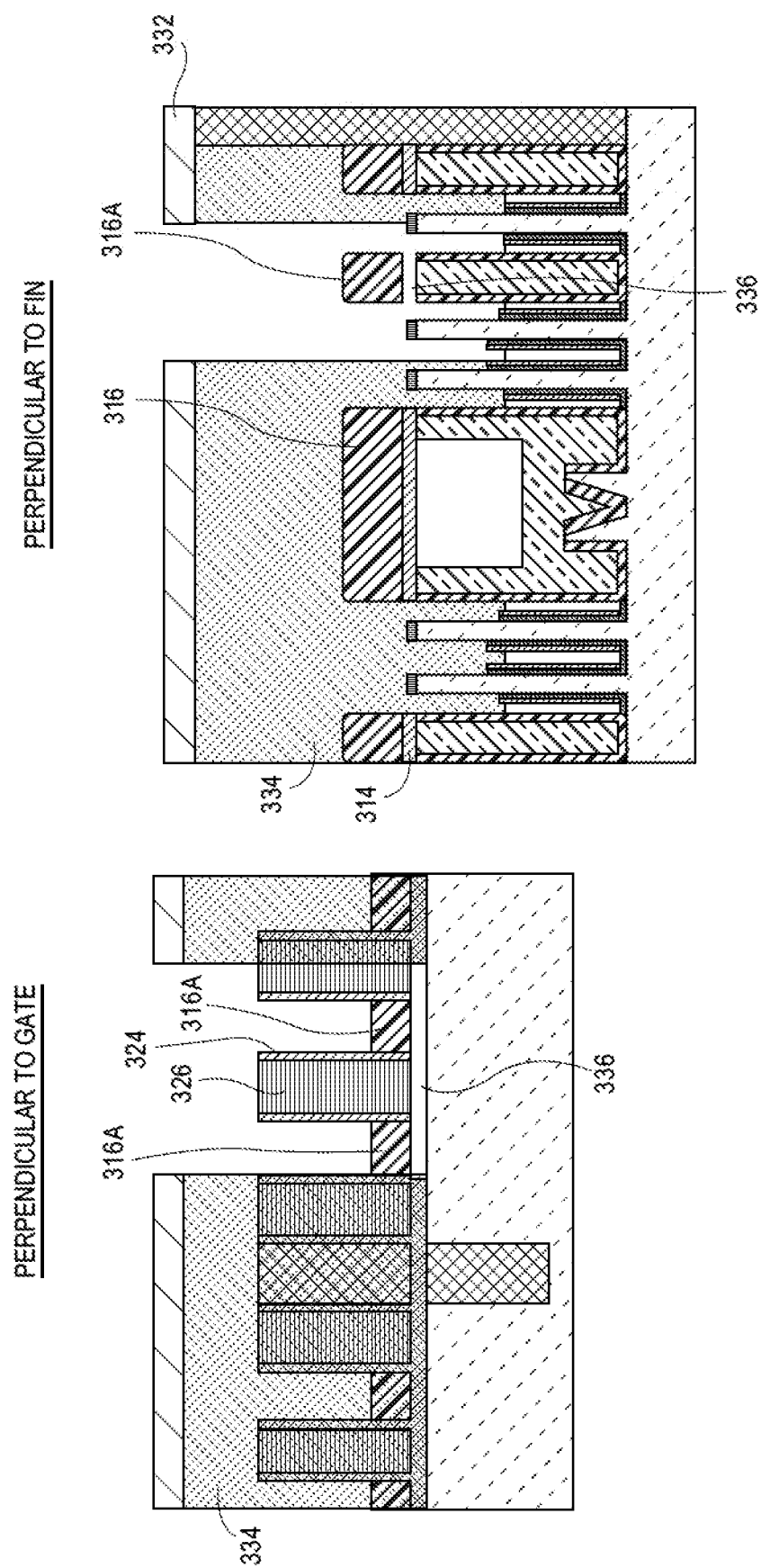

Referring to FIG. 3E, a cross-sectional view representing a "Perpendicular to Gate" view is on the left-hand side, and a cross-sectional view representing a "Perpendicular to Fin" view is on the right-hand side. At this stage, the sacrificial hardmask material 330 of FIG. 3D is etched using patterning mask 332 to form patterned sacrificial hardmask material 334. The patterned sacrificial hardmask material 334 exposes the sacrificial cap 314 of a select one (or ones) of the SAGE structures. The sacrificial cap 314 of a select one (or ones) of the SAGE structures is then removed to leave a discrete cap 316A above a void 336 (e.g., remaining cap 316 over void 336 following sacrificial cap 314 removal). It is to be appreciated that the discrete cap 316A is anchored by remaining sacrificial cap portions at locations into and out of the page of the right-hand side structure.

Figure 3F:
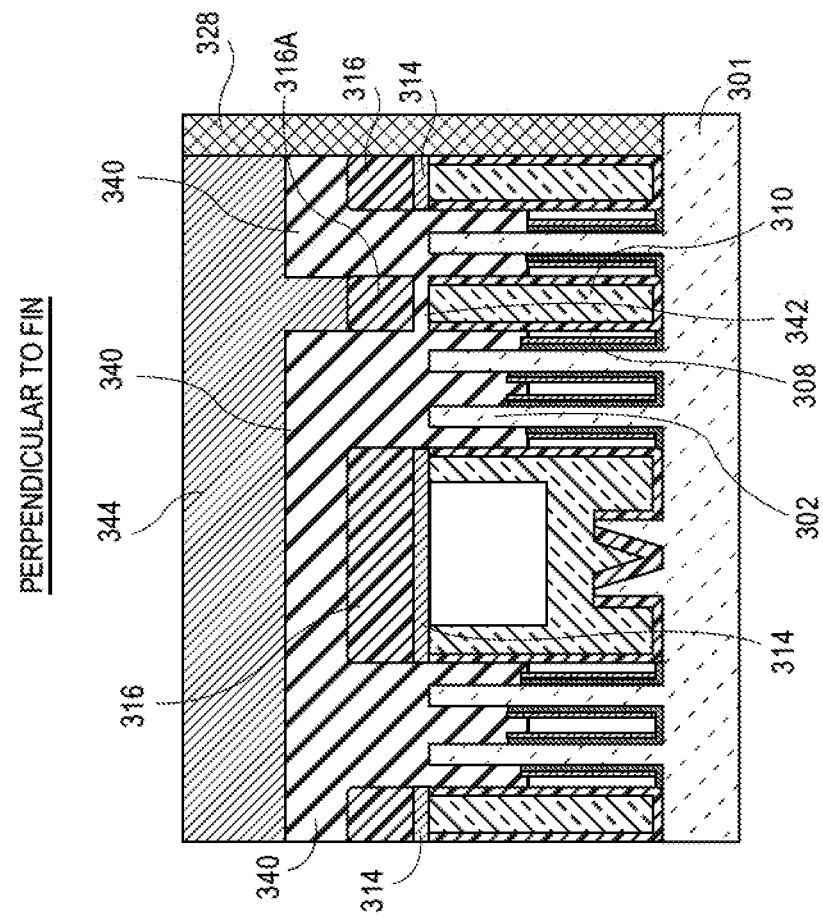
Figure 3F:
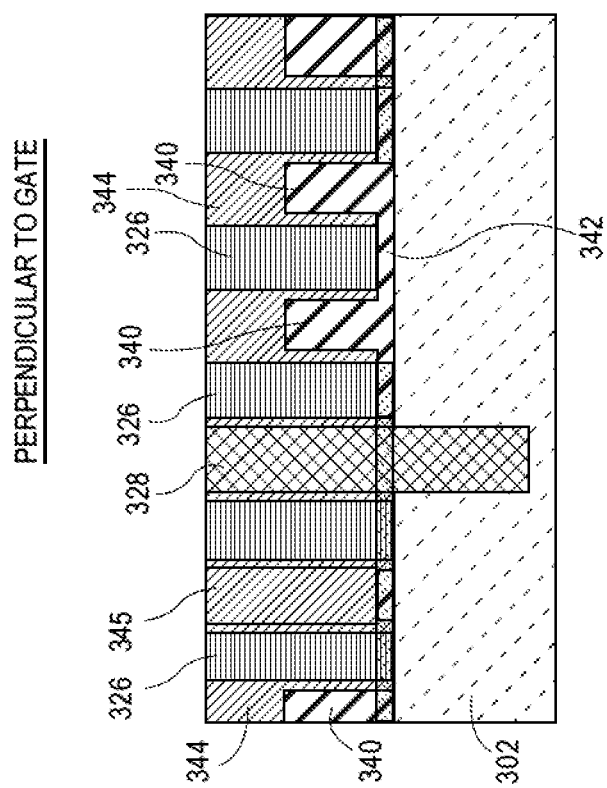

Referring to FIG. 3F, a cross-sectional view representing a "Perpendicular to Gate" view is on the left-hand side, and a cross-sectional view representing a "Perpendicular to Fin" view is on the right-hand side. At this stage, patterning mask 332 and sacrificial hardmask material 334 are removed. Gate stack materials are subsequently formed in gate trenches 322. For example, a gate stack 340 is formed, which may include a gate dielectric and gate electrode and, possibly local gate contact materials. A conductive portion of the gate stack materials fills void 336 to form a local gate-to-gate interconnect 342. A gate insulating layer 344 may be formed over the gate stack materials, and may include gate plug regions, as is depicted.

Figure 3G:
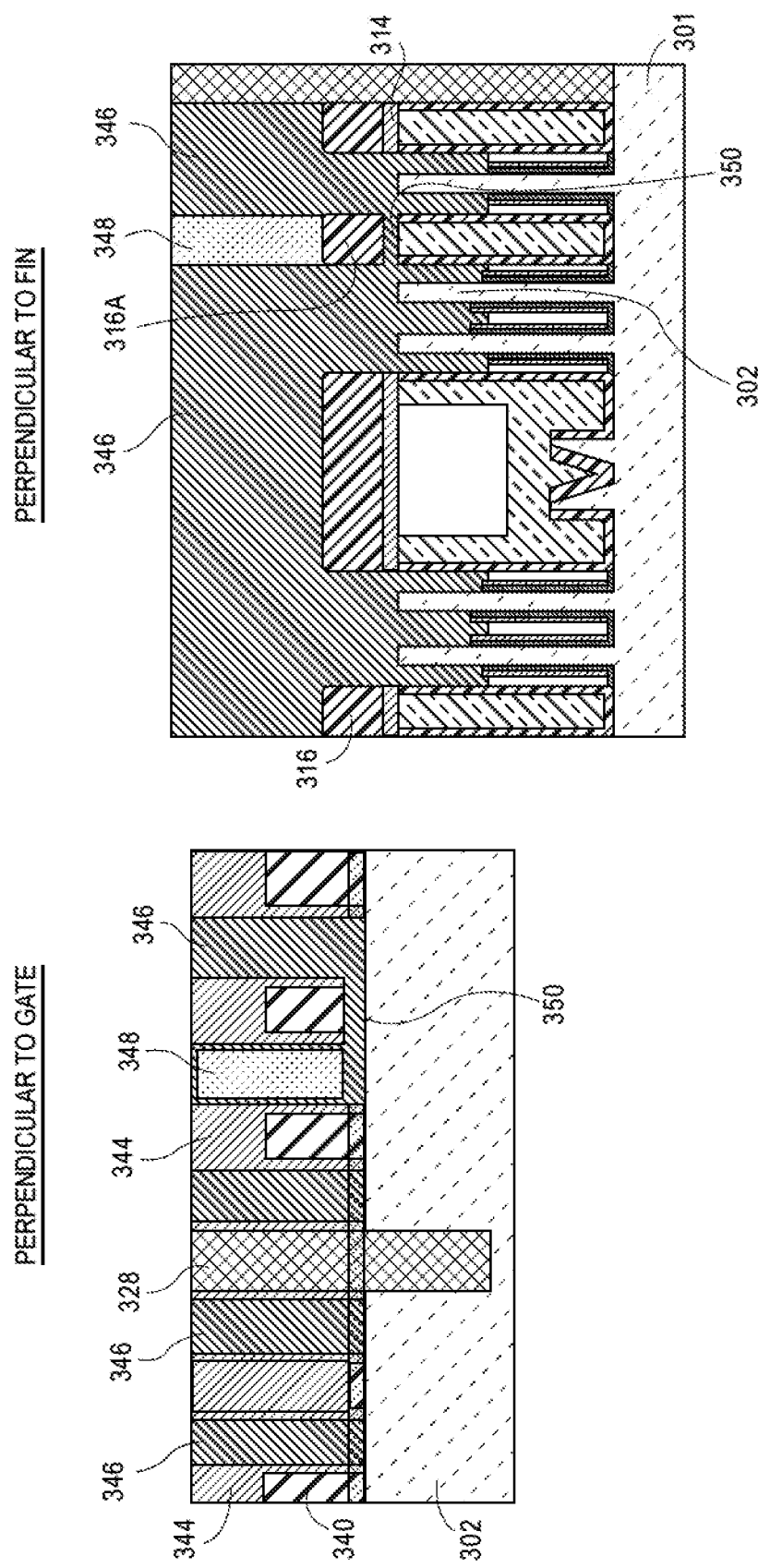

Referring to FIG. 3G, a cross-sectional view representing a "Perpendicular to Gate" view is on the left-hand side, and a cross-sectional view representing a "Perpendicular to Fin" view at source/drain (S/D) is on the right-hand side. At this stage, interlayer dielectric material 326 is removed to form trench contact openings. Conductive trench contact material is subsequently formed in the trench contact openings. For example, a trench contact 346 is formed in a source or drain location. A portion of the conductive trench contact material fills a void formed through a SAGE structure to form a local contact-to-contact interconnect 350 (e.g., in a similar manner to forming local gate-to-gate interconnect 342). A contact plug 348 may have been formed prior to the formation of trench contact 346, as is depicted.

In a second aspect, embodiments described herein involve the use of multiple patterned gate etches to create local gate-gate interconnects. Initially, gate patterning is performed in a traditional format through dual or quadruple patterning, direct print, or another litho-etch-litho-etch approach. Subsequently, a timed gate etch is performed to transfer the resulting pattern into dummy gate. Next, a perpendicular mask is used to pattern the remainder of the etched structure to provide local polysilicon-polysilicon interconnects which are subsequently substituted with a conductive material, e.g., by a replacement approach.

Figure 4:
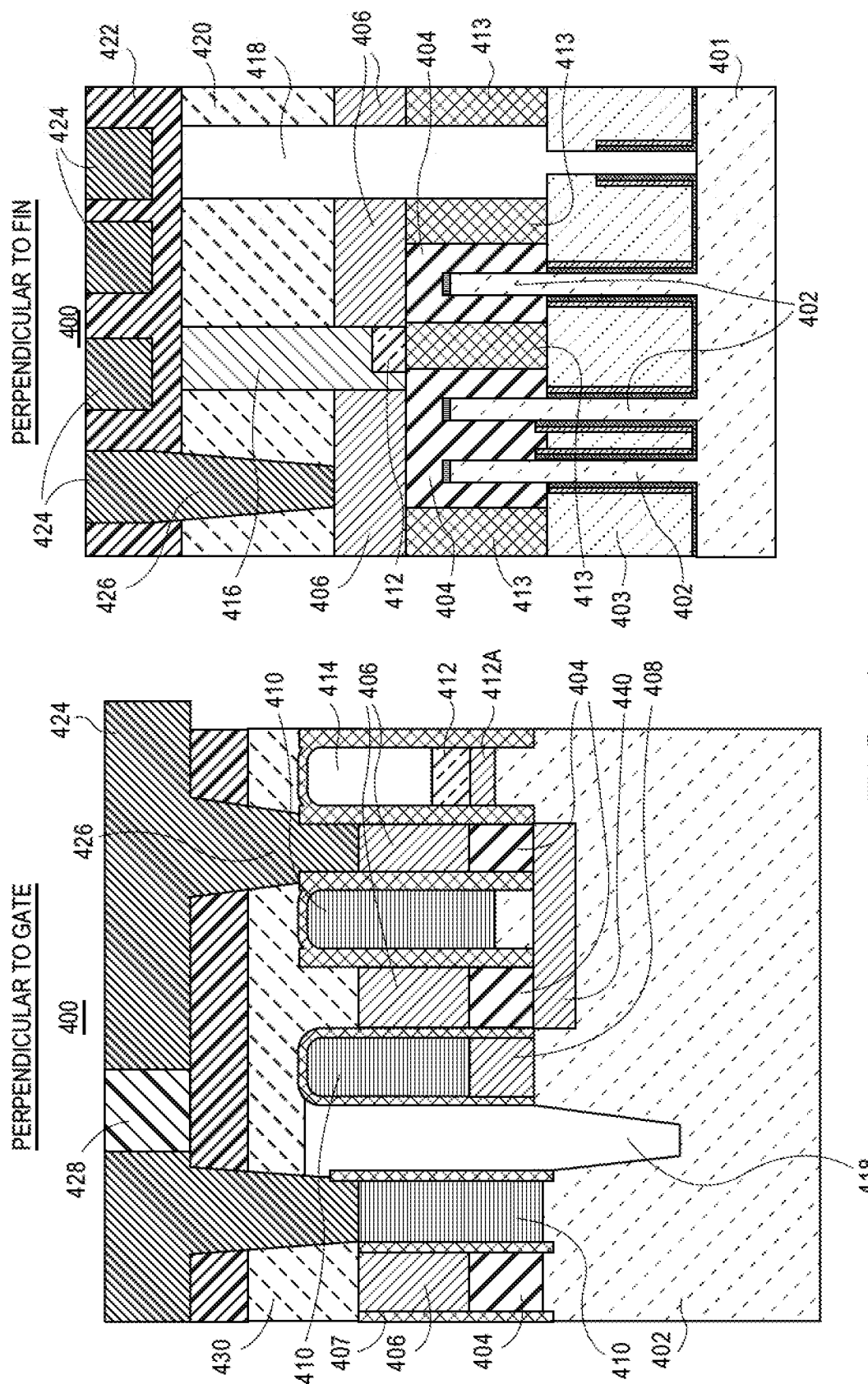
FIG. 4 illustrates cross-sectional views of an integrated circuit structure including a self-aligned gate endcap (SAGE) architecture having a local interconnect, in accordance with an embodiment of the present disclosure.

As an exemplary structure of the second aspect, FIG. 4 illustrates cross-sectional views of an integrated circuit structure including a self-aligned gate endcap (SAGE) architecture having a local interconnect, in accordance with an embodiment of the present disclosure. A cross-sectional view representing a "Perpendicular to Gate" view is on the left-hand side of FIG. 4, and a cross-sectional view representing a "Perpendicular to Fin" view is on the right-hand side of FIG. 4.

Referring to FIG. 4, an integrated circuit structure 400 includes semiconductor fins 402 protruding from a semiconductor substrate 401. Gate structures over the fins 402 include a gate electrode 404 and a local gate contact 406 on the gate electrode 404. Gate sidewall spacers 407 may also be included. Trench contact structures may include a first contact portion 408 and a second contact portion 410, or only the second contact portion 410, examples of both of which are depicted. A SAGE architecture includes a self-aligned wall (SAW) feature 412 on a SAGE structure 413 or other SAGE feature 412A. A contact plug 414 is on a first portion of the SAW feature 412, and a gate plug 416 is on a second portion of the SAW feature 412. A fin trim isolation structure 418 isolates a fin 402 into two different portions. Gate insulating layers 420 or other dielectric layer 430 may be include over the above described structures. An overlying inter-layer dielectric (ILD) material includes metal lines 424 therein. Ones of the metal lines 424 may have associated conductive vias 426. A single metal line 426 may include a plug 428 therein to isolate two different portions of the single metal line 426.

With reference again to FIG. 4, a local gate to gate interconnect 440 is fabricated between adjacent gate electrodes 404, as is depicted in the left-hand portion of FIG. 4. It is to be appreciated that the local gate to gate interconnect 440 is actually projected in front of the fin 402 of the illustration and, in an embodiment, is on a trench isolation region 403 located adjacent the fin 402. Gate to gate interconnection is achieved by effectively joining between adjacent gate electrodes 404 at bottom locations of the adjacent gate electrodes 404.

With reference again to FIG. 2, and as is elaborated in FIGS. 5A-5J described below, an integrated circuit structure 400 includes a semiconductor fin 402 protruding through a trench isolation region 403 above a substrate 401, the semiconductor fin 402 having a top surface. A first gate structure 404/406 is over the semiconductor fin 402 and over the trench isolation region 403. A second gate structure 404/406 is over the semiconductor fin 402 and over the trench isolation region 403. A local gate interconnect 440 is on the trench isolation region 403. The local gate interconnect 440 is in contact with the first and second gate structures 404/406, e.g., at bottom locations of gate electrodes 404. The local gate interconnect 440 has a top surface below the top surface of the semiconductor fin 402.

In an embodiment, the local gate interconnect 440 is continuous with the first and second gate structures 404. In an embodiment, the trench isolation region 403 is over a fin stub 508, as exemplified in FIG. 5A described below. In an embodiment, the local gate interconnect 440 is in contact with a gate endcap isolation structure, as exemplified in FIG. 5H described below.

As an exemplary processing scheme for the second aspect, FIGS. 5A-5J illustrates cross-sectional views representing various operations in a method of fabricating an integrated circuit structure including a self-aligned gate endcap (SAGE) architecture having a local interconnect, in accordance with an embodiment of the present disclosure.

Referring to FIG. 5A, a cross-sectional view representing a "Cut In Front of Fin" is on the left-hand side, and a cross-sectional view representing a "Cut Through Source/Drain (S/D)" is on the right-hand side. At this stage, a dummy gate material 502 is formed over a plurality of fins 506 (and, possibly, fin stubs 508), shallow trench isolation (STI) regions 510, and SAGE structures 512/514/516 above a substrate 501. A patterned hardmask 504 is formed above the dummy gate material 502.

Figure 5B:
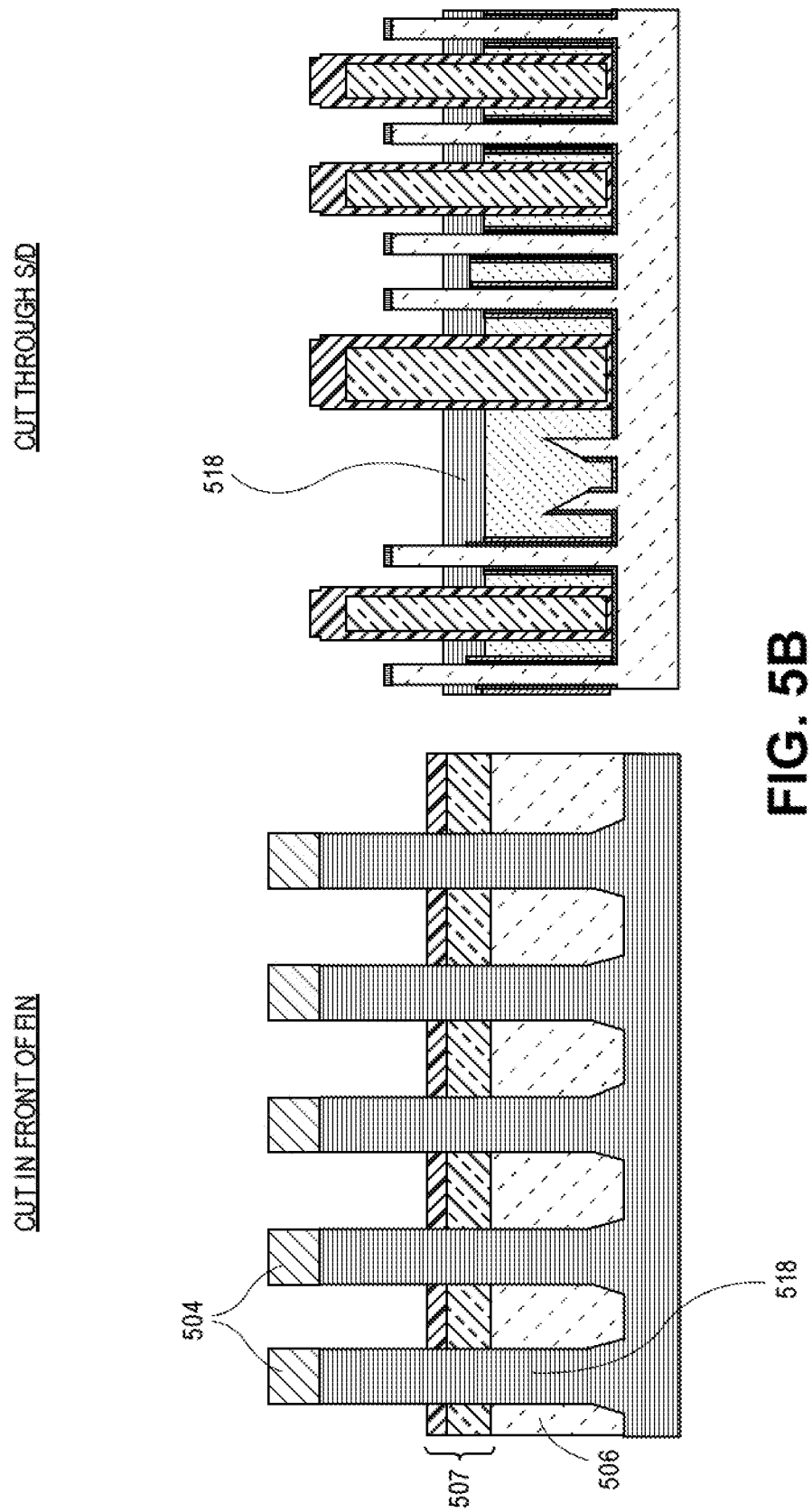

Referring to FIG. 5B, a cross-sectional view representing a "Cut In Front of Fin" is on the left-hand side, and a cross-sectional view representing a "Cut Through Source/Drain (S/D)" is on the right-hand side. At this stage, a plurality of dummy gates has been formed over a fin 506 using patterned hardmask 504 as an etch mask to pattern dummy gate material 502. It is to be appreciated that the arrangement on the left-hand side does not represent a flush cut through the fin but rather shows the structures viewable when observed in a perspective taken along a single fin. For example, certain SAGE features 507 may be viewable from this perspective, as is depicted. As viewable in both left-hand and right-hand views, the etch to form the plurality of dummy gates is not performed to completion in order to preserve a continuous portion 518 of the dummy gate material 502. For example, as depicted, the patterning maintains continuous portion 518 on an STI region 510 between a fin 506 and a neighboring SAGE structure.

Figure 5C:
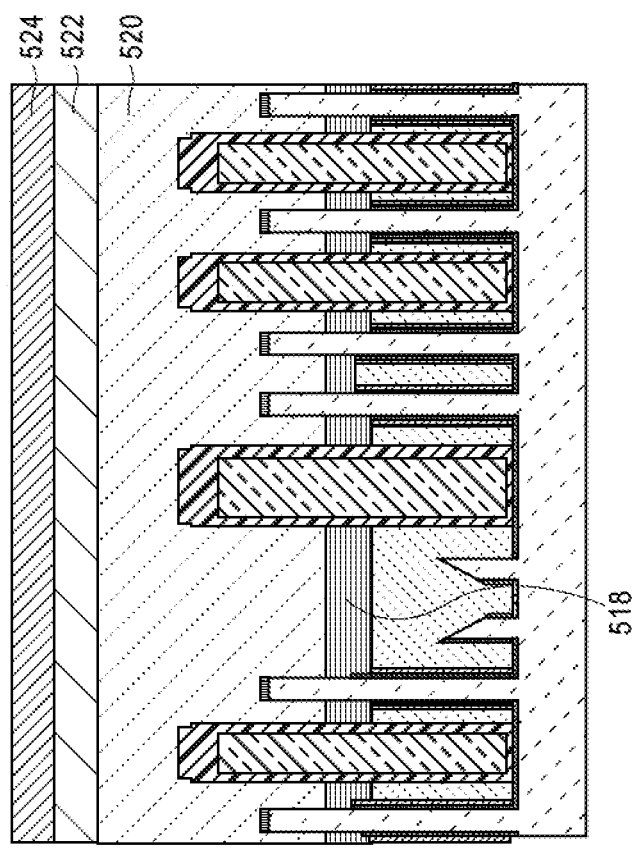
Figure 5C:
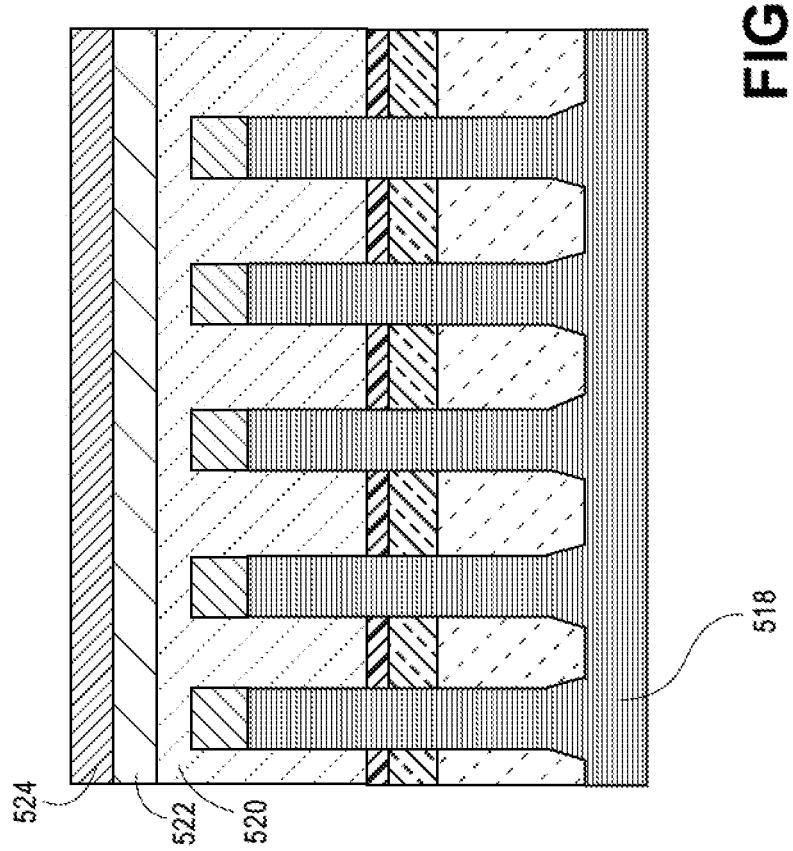

Referring to FIG. 5C, a cross-sectional view representing a "Cut In Front of Fin" is on the left-hand side, and a cross-sectional view representing a "Cut Through Source/Drain (S/D)" is on the right-hand side. At this stage, a sacrificial hardmask material 520 and a patterning mask including a lower hardmask layer 522 and an upper hardmask layer 524 are formed over the structure of FIG. 5B.

Figure 5D:
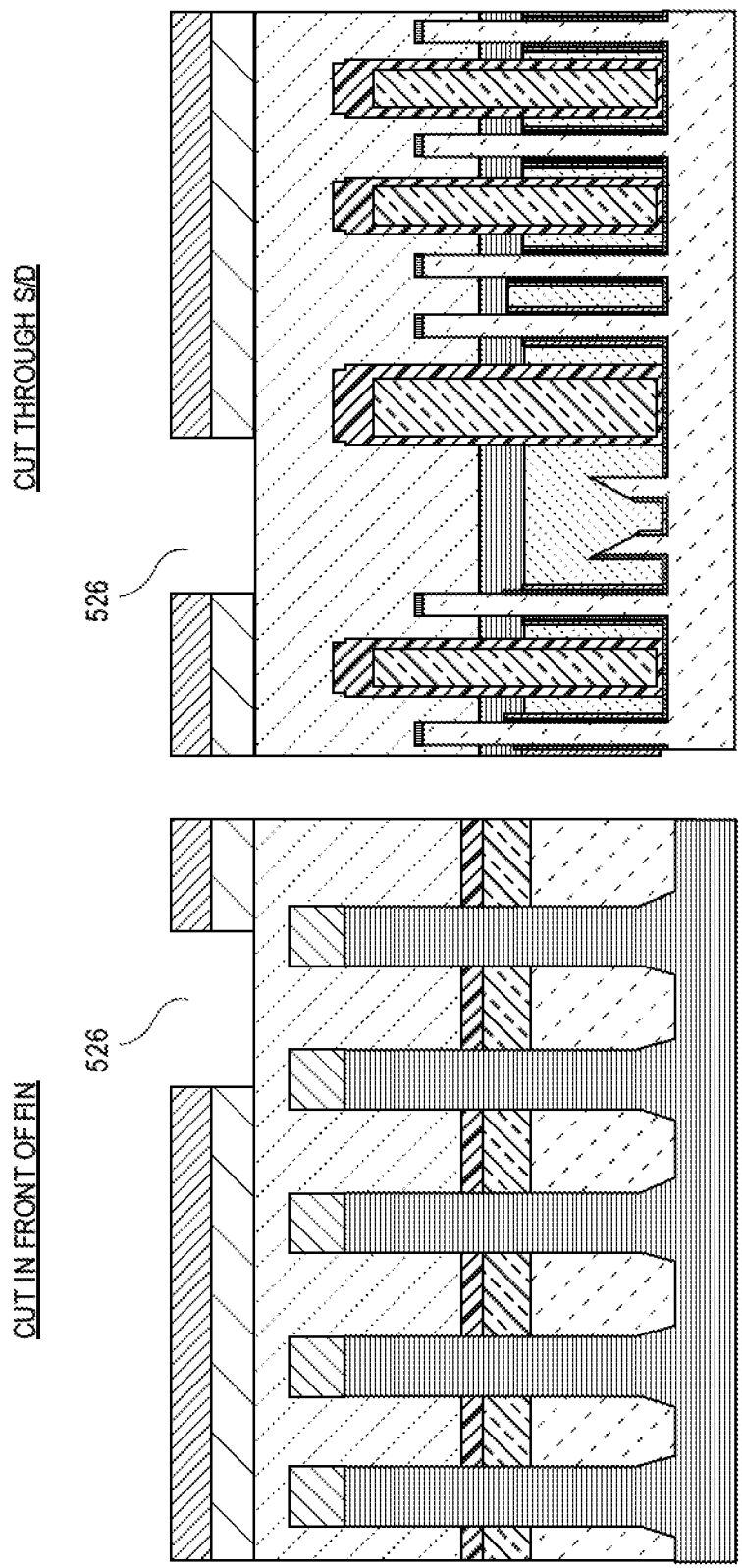

Referring to FIG. 5D, a cross-sectional view representing a "Cut In Front of Fin" is on the left-hand side, and a cross-sectional view representing a "Cut Through Source/Drain (S/D)" is on the right-hand side. At this stage, an opening 526 in the lower hardmask layer 522 and the upper hardmask layer 524 is formed in a location where a local interconnect is ultimately formed.

Figure 5E:
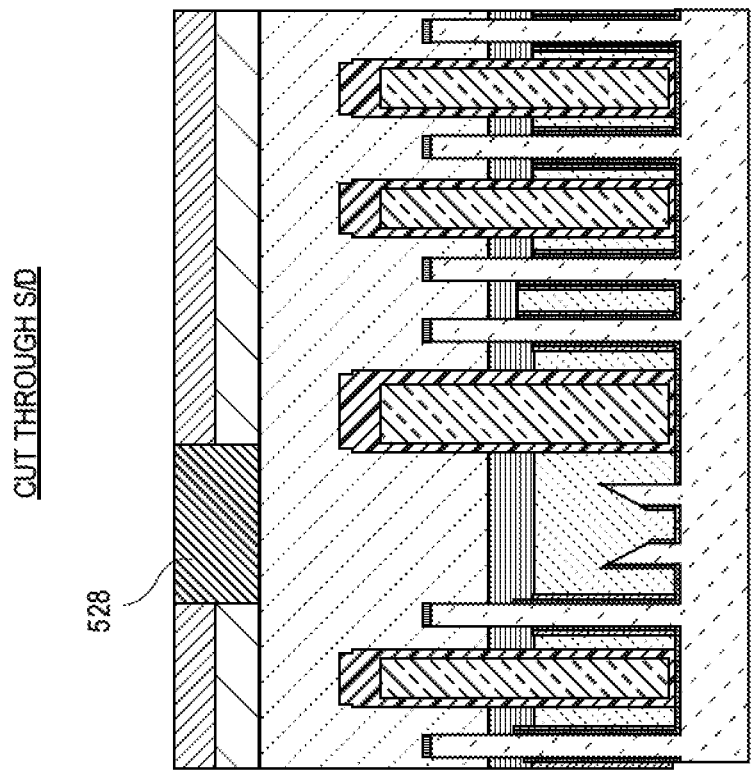
Figure 5E:
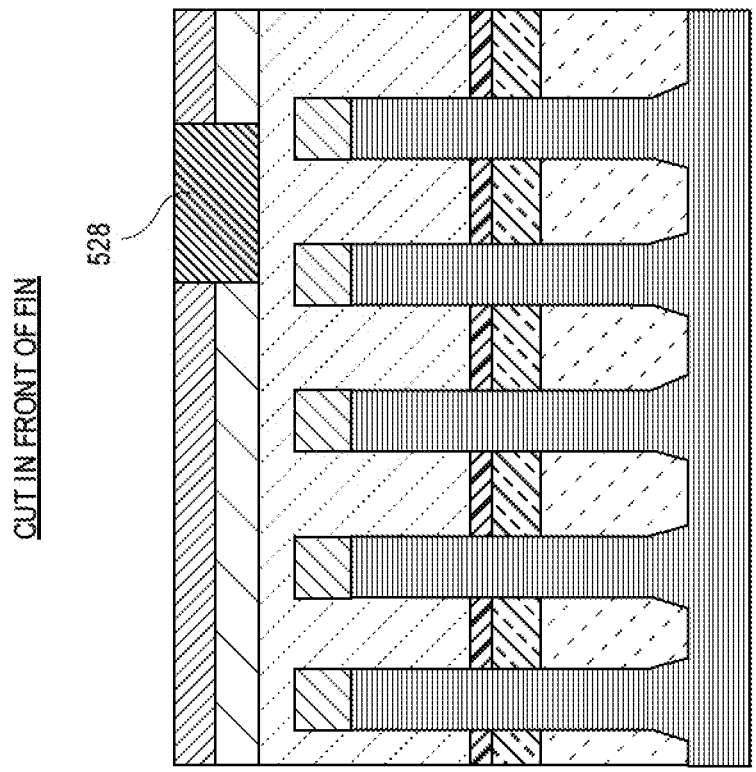

Referring to FIG. 5E, a cross-sectional view representing a "Cut In Front of Fin" is on the left-hand side, and a cross-sectional view representing a "Cut Through Source/Drain (S/D)" is on the right-hand side. At this stage, a blocking material 528 is formed in opening 526 in the lower hardmask layer 522 and the upper hardmask layer 524 in the location where a local interconnect is ultimately formed.

Figure 5F:
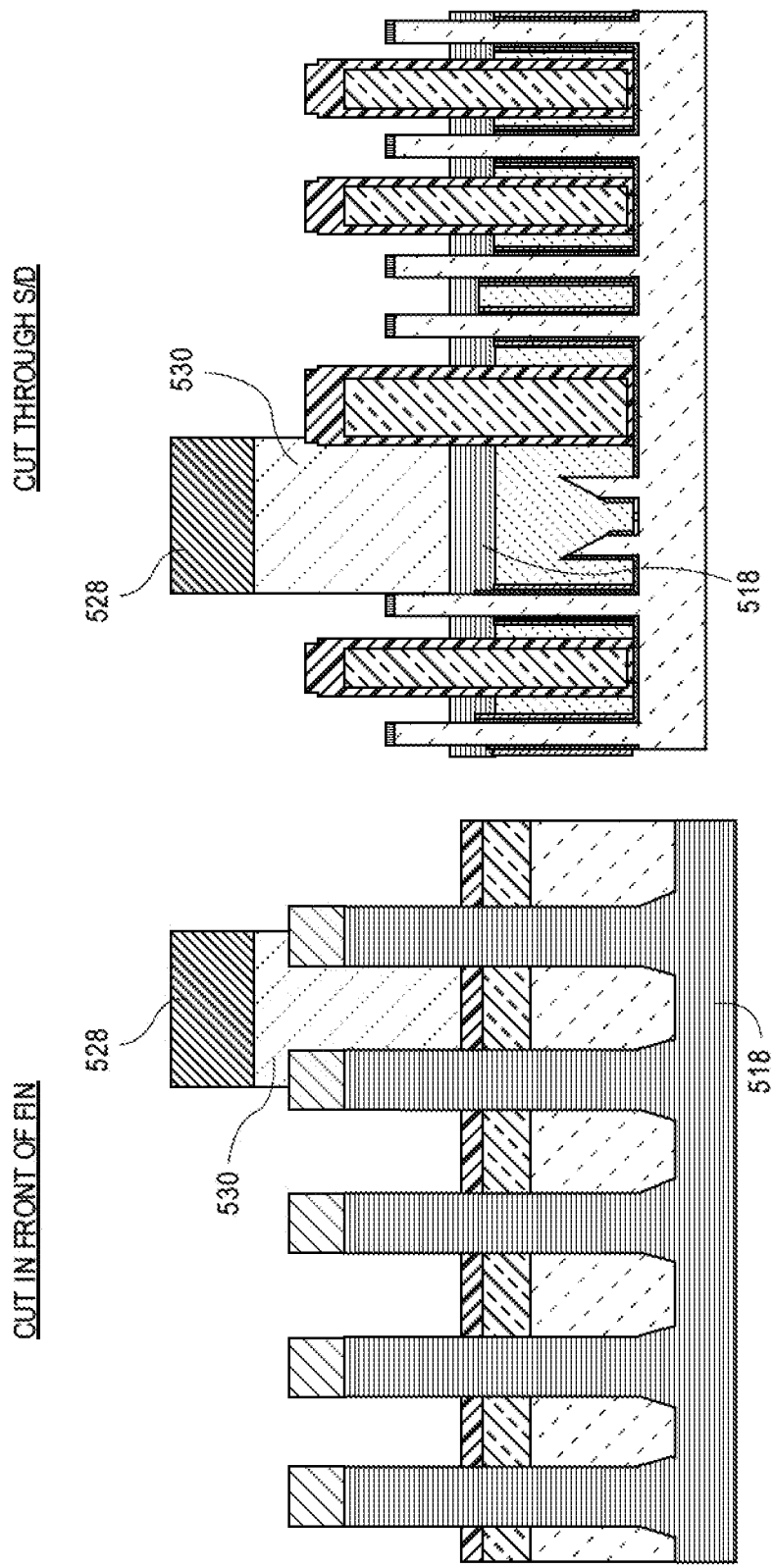

Referring to FIG. 5F, a cross-sectional view representing a "Cut In Front of Fin" is on the left-hand side, and a cross-sectional view representing a "Cut Through Source/Drain (S/D)" is on the right-hand side. At this stage, the patterned lower hardmask layer 522 and the upper hardmask layer 524 are removed. The sacrificial hardmask material 520 is patterned using blocking material 528 as a mask to form patterned sacrificial hardmask material 530 over a portion of the continuous portion 518 of the dummy gate material 502 in the location where a local interconnect is ultimately formed.

Figure 5G:
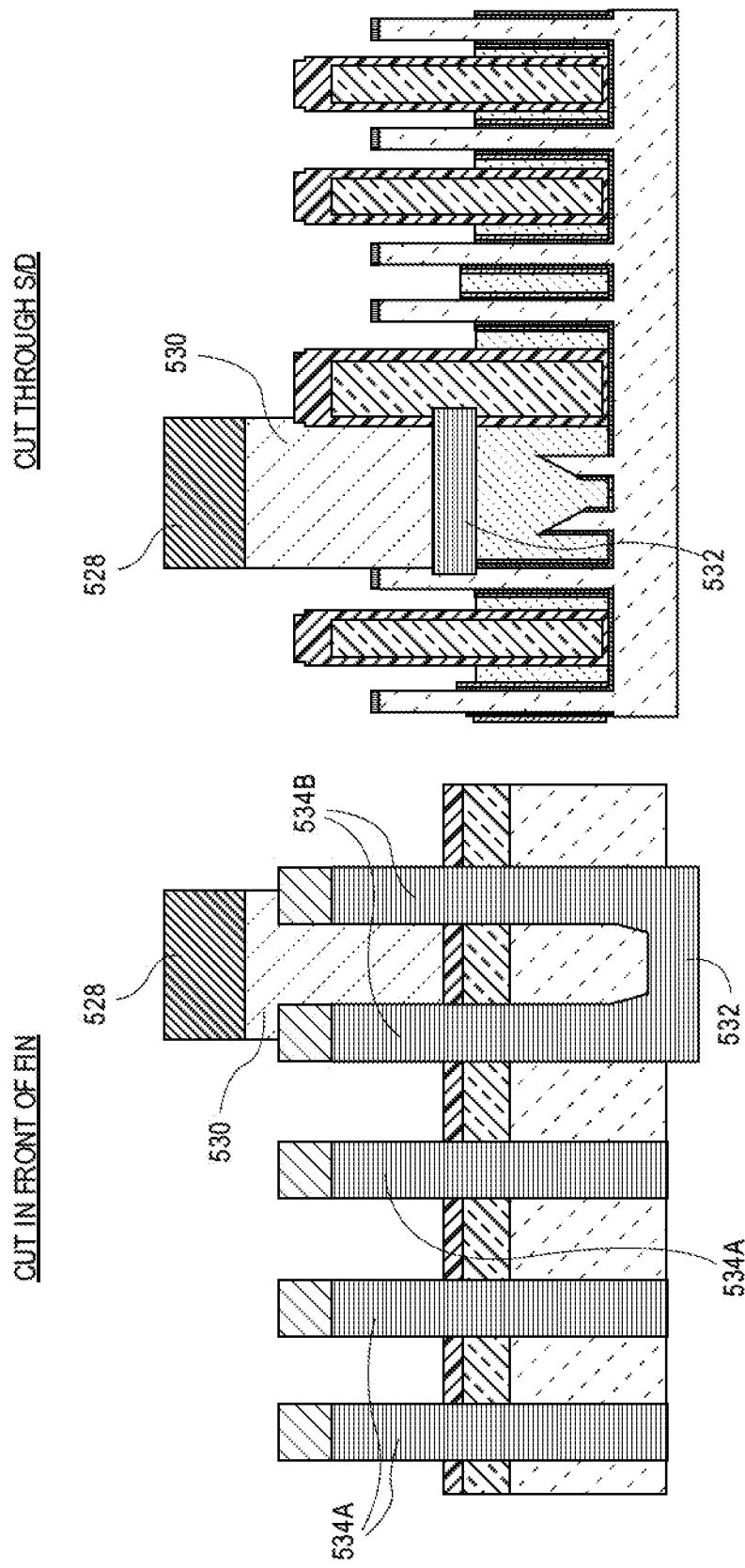

Referring to FIG. 5G, a cross-sectional view representing a "Cut In Front of Fin" is on the left-hand side, and a cross-sectional view representing a "Cut Through Source/Drain (S/D)" is on the right-hand side. At this stage, the pattern of blocking material 528 and patterned sacrificial hardmask material 530 is used to pattern the continuous portion 518 of the dummy gate material 502 in the location where a local interconnect is ultimately formed. The patterning removes a portion 532 of the continuous portion 518 of the dummy gate material 502 and removes portions not covered by the pattern of blocking material 528 and patterned sacrificial hardmask material 530. The patterning of also leaves discrete dummy gate lines 534A as well as dummy gate lines 534B coupled through the portion 532 of the continuous portion 518 of the dummy gate material 502. The process of FIGS. 5C-5G may be referred to as an inversion patterning approach since the material under the initial opening formed is ultimately retained during patterning.

Figure 5H:
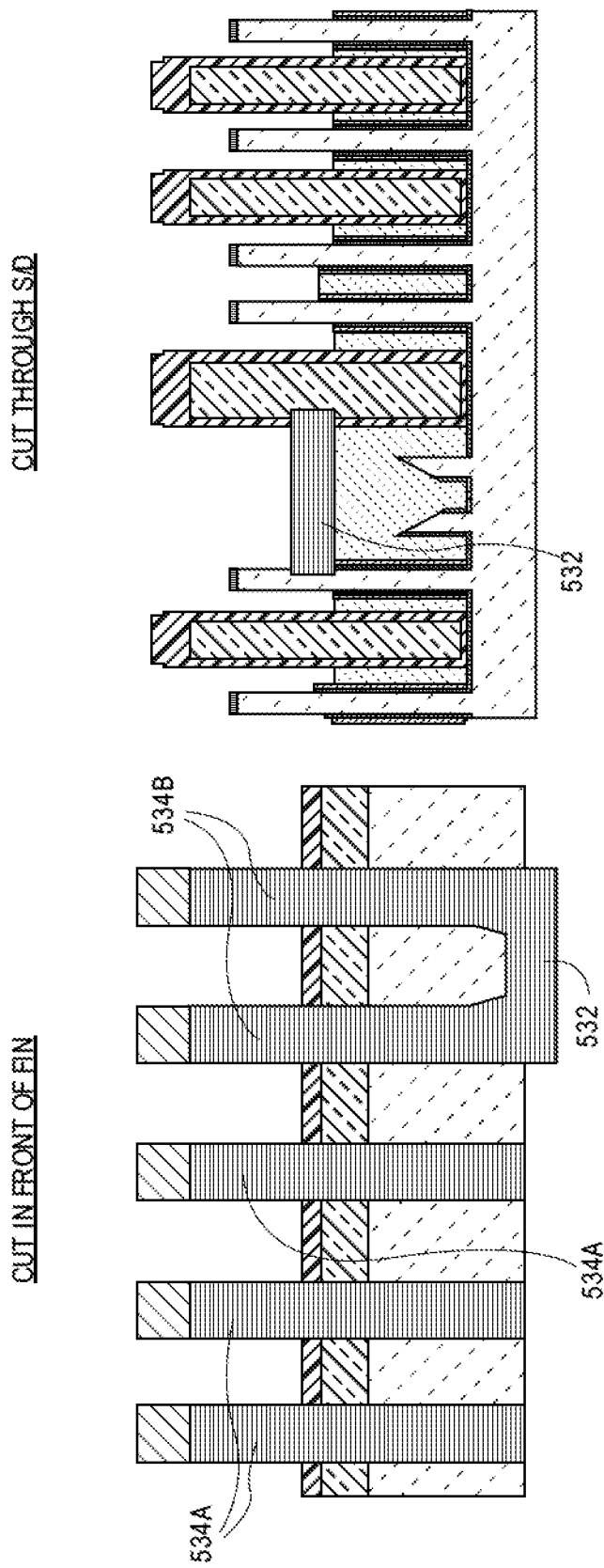

Referring to FIG. 5H, a cross-sectional view representing a "Cut In Front of Fin" is on the left-hand side, and a cross-sectional view representing a "Cut Through Source/Drain (S/D)" is on the right-hand side. At this stage, the blocking material 528 and patterned sacrificial hardmask material 530 are removed from the structure of FIG. 5G. Portion 532 of the continuous portion 518 of the dummy gate material 502, discrete dummy gate lines 534A, and dummy gate lines 534B coupled through the portion 532 of the continuous portion 518 of the dummy gate material are retained.

Figure 5I:
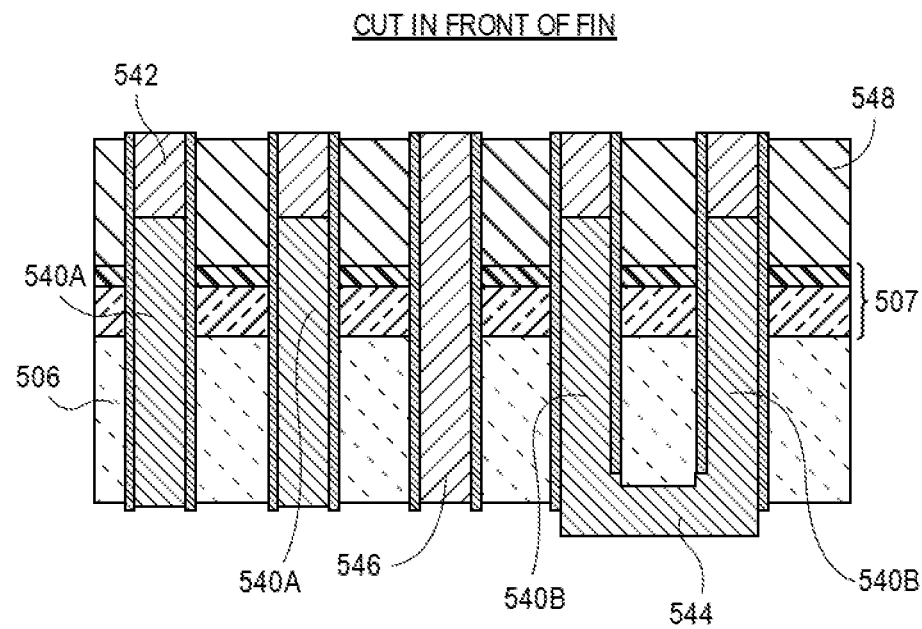

Referring to FIG. 5I, a cross-sectional view representing a "Cut In Front of Fin" is depicted. At this stage, an inter-layer dielectric (ILD) material 548 is formed over the structure of FIG. 5H and planarized. The hardmask 504 is removed in the planarization process or in a subsequent etch process. Additionally, portion 532 of the continuous portion 518 of the dummy gate material 502, discrete dummy gate lines 534A, and dummy gate lines 534B are removed and replaced with gate stack materials, e.g., in a replacement gate process. For example, permanent gate stack materials may include a gate dielectric and gate electrode and, possibly local gate contact materials. In particular, discrete permanent gate lines 540A as well as permanent gate lines 540B are formed. Additionally, the portion 532 of the continuous portion 518 of the dummy gate material 502 is replaced with a conductive portion of the gate stack materials to form a local gate-to-gate interconnect 544. A gate insulating layer 542 may be formed over the gate stack materials, as is depicted. Also, a through gate isolation structure 546 may be formed at this stage, as is depicted.

Figure 5J:
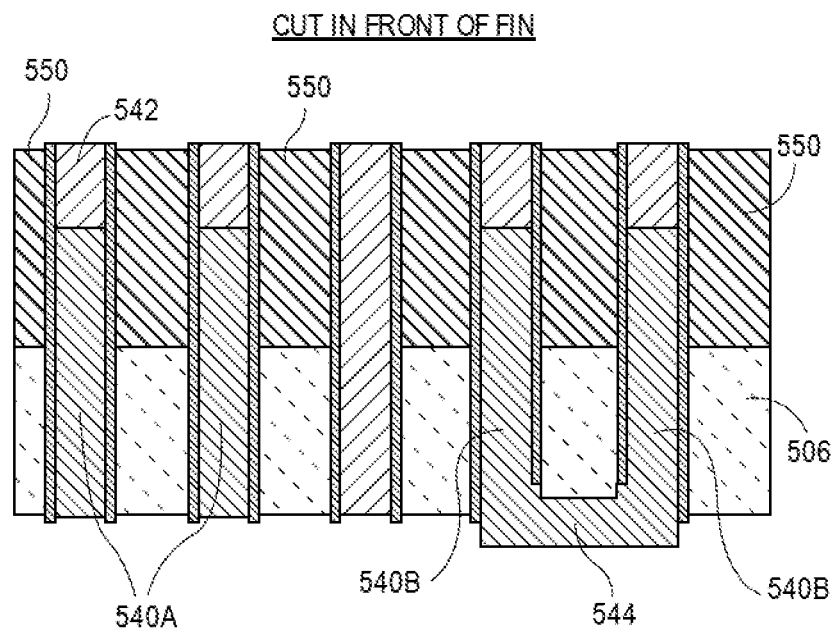

Referring to FIG. 5J, a cross-sectional view representing a "Cut In Front of Fin" is depicted. At this stage, interlayer dielectric material 548 is removed to form trench contact openings. Conductive trench contact material is subsequently formed in the trench contact openings. For example, trench contacts 540 are formed in source or drain locations.

Figure 6:
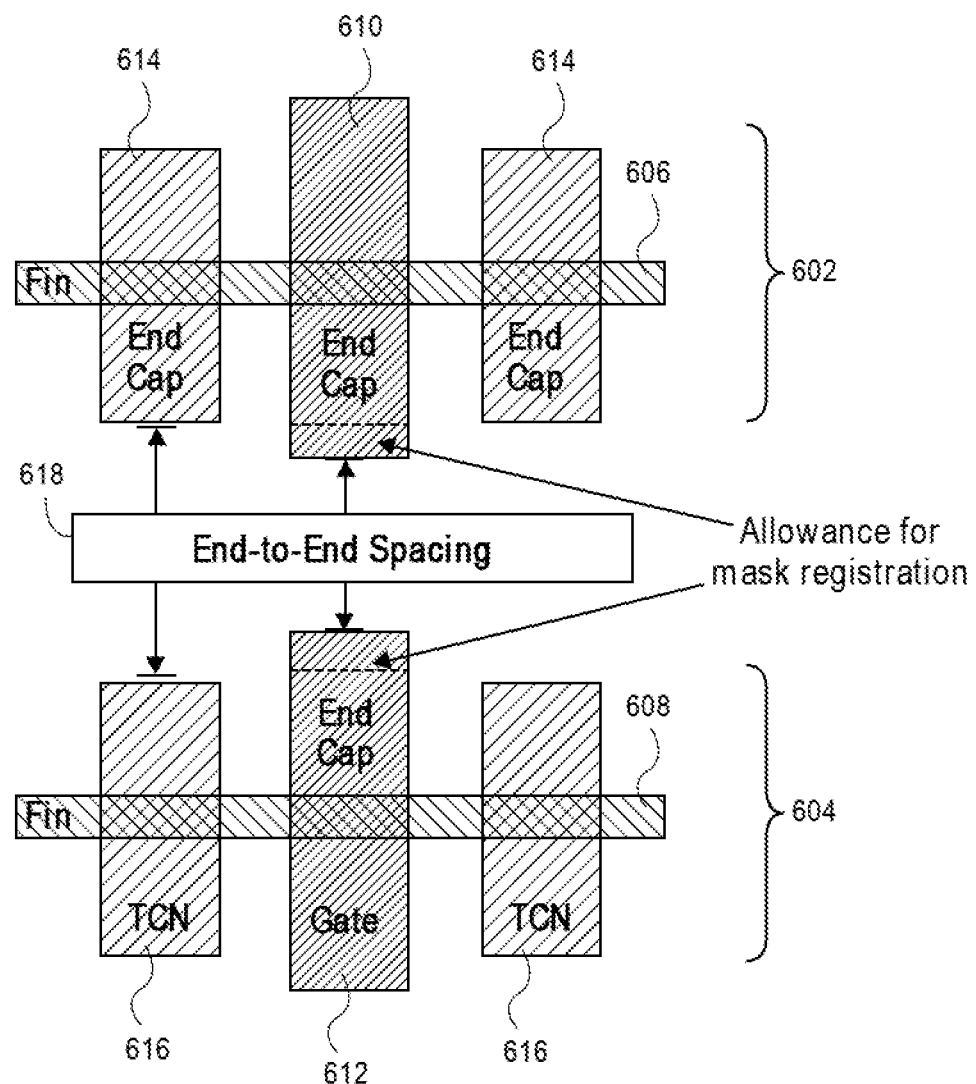
FIG. 6 illustrates a plan view of a layout including fin-based integrated circuit structures accommodating end-to-end spacing.

To provide a foundation for SAGE concepts relevant to embodiments described herein, scaling of gate endcap and trench contact (TCN) endcap regions are important contributors towards improving transistor layout area and density. Gate and TCN endcap regions refer to gate and TCN overlap of the diffusion region/fins of integrated circuit structures. As an example, FIG. 6 illustrates a plan view of a layout 600 including fin-based integrated circuit structures accommodating end-to-end spacing. Referring to FIG. 6, first 602 and second 604 integrated circuit structures are based on semiconductor fins 606 and 608, respectively. Each device 602 and 604 has a gate electrode 610 or 612, respectively. Additionally, each device 602 and 604 has trench contacts (TCNs) 614 and 616, respectively, at source and drain regions of the fins 606 and 608, respectively. The gate electrodes 610 and 612 and the TCNs 614 and 616 each have an end cap region, which is located off of the corresponding fins 606 and 608, respectively.

Referring again to FIG. 6, typically, gate and TCN endcap dimensions must include an allowance for mask registration error to ensure robust transistor operation for worst case mask mis-registration, leaving an end-to-end spacing 618. Thus, another important design rule critical to improving transistor layout density is the spacing between two adjacent endcaps facing each other. However, the parameters of "2*Endcap+End-to-End Spacing" are becoming increasingly difficult to scale using lithographic patterning to meet the scaling requirements for new technologies. In particular, the additional endcap length required to allow for mask registration error also increases gate capacitance values due to longer overlap length between TCN and gate electrodes, thereby increasing product dynamic energy consumption and degrading performance. Previous solutions have focused on improving registration budget and patterning or resolution improvements to enable shrinkage of both endcap dimension and endcap-to-endcap spacing.

In accordance with an embodiment of the present disclosure, approaches are described which provide for self-aligned gate endcap and TCN overlap of a semiconductor fin without any need to allow for mask registration. In one such embodiment, a disposable spacer is fabricated on the semiconductor fin endcaps which determines the gate endcap and the contact overlap dimensions. The spacer defined endcap process enables the gate and TCN endcap regions to be self-aligned to the semiconductor fin and, therefore, does not require extra endcap length to account for mask mis-registration. Furthermore, approaches described herein do not require lithographic patterning at previously required stages since the gate and TCN endcap/overlap dimensions remain fixed, leading to improvement (i.e., reduction) in device to device variability in electrical parameters.

In order to provide a side-by-side comparison, FIGS. 7A-7D illustrate cross-sectional views of process operations of significance in a conventional finFET or tri-gate process fabrication scheme, while FIGS. 8A-8D illustrate cross-sectional views of process operations of significance in a self-aligned gate endcap (SAGE) process fabrication scheme for finFET or tri-gate devices, in accordance with an embodiment of the present disclosure.

Figures 7A, 8A:
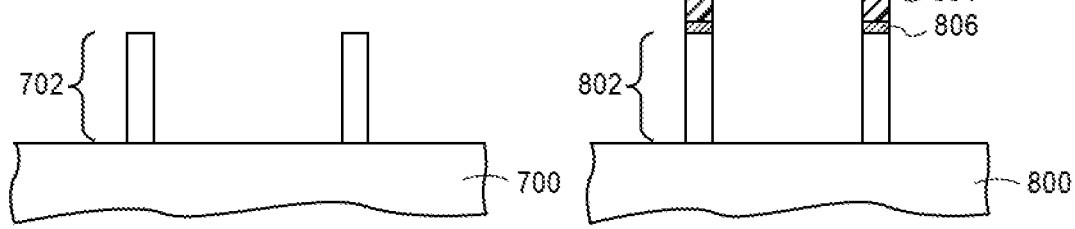
FIGS. 7A-7D illustrate cross-sectional views of process operations of significance in a conventional finFET or tri-gate process fabrication scheme.
FIGS. 8A-8D illustrate cross-sectional views of process operations of significance in a self-aligned gate endcap (SAGE) process fabrication scheme for finFET or tri-gate devices, in accordance with an embodiment of the present disclosure.

Referring to FIGS. 7A and 8A, a bulk semiconductor substrate 700 or 800, such as a bulk single crystalline silicon substrate is provided having fins 702 or 802, respectively, etched therein. In an embodiment, the fins are formed directly in the bulk substrate 700 or 800 and, as such, are formed continuous with the bulk substrate 700 or 800. It is to be appreciated that within the substrate 700 or 800, shallow trench isolation structures may be formed between fins. Referring to FIG. 8A, a hardmask layer 804, such as a silicon nitride hardmask layer, and a pad oxide layer 806, such as a silicon dioxide layer, remain atop fins 802 following patterning to form the fins 802. By contrast, referring to FIG. 7A, such a hardmask layer and pad oxide layer have been removed.

Figures 7B, 8B:
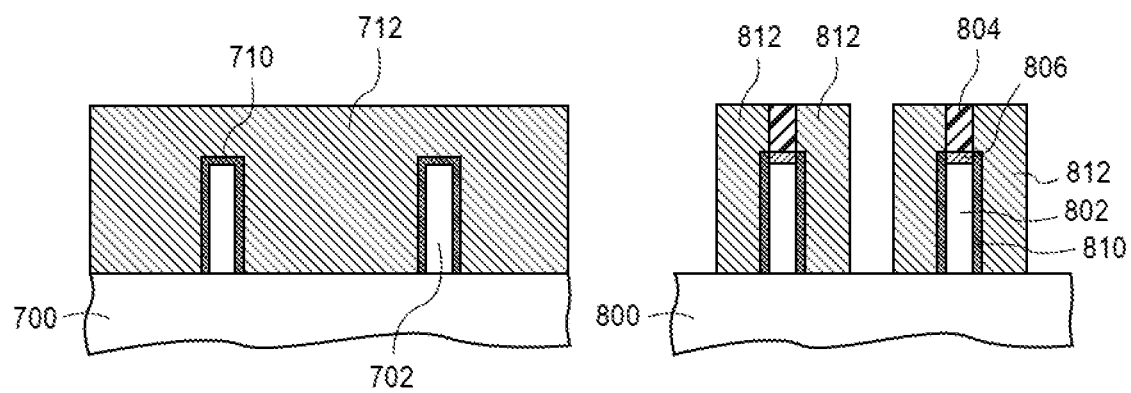

Referring to FIG. 7B, a dummy or permanent gate dielectric layer 710 is formed on the exposed surfaces of the semiconductor fins 702, and a dummy gate layer 712 is formed over the resulting structure. By contrast, referring to FIG. 8B, a dummy or permanent gate dielectric layer 810 is formed on the exposed surfaces of the semiconductor fins 802, and dummy spacers 812 are formed adjacent to the resulting structure.

Figure 7C:
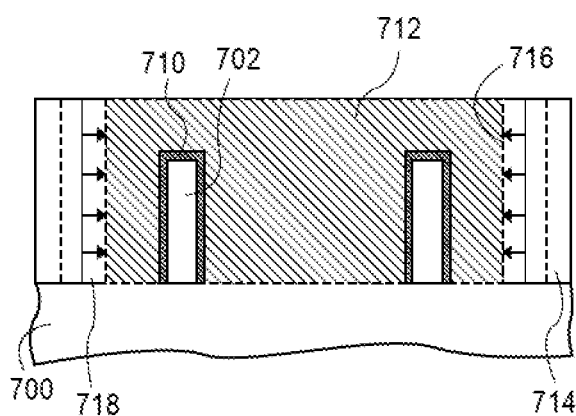

Referring to FIG. 7C, gate endcap cut patterning is performed and isolation regions 714 are formed at the resulting patterned dummy gate ends 716. In the conventional process scheme, a larger gate endcap must be fabricated to allow for gate mask mis-registration, as depicted by the arrowed regions 718. By contrast, referring to FIG. 8C, self-aligned isolation regions 814 are formed by providing an isolation layer over the structure of FIG. 8B, e.g., by deposition and planarization. In one such embodiment, the self-aligned gate endcap process does not require extra space for mask registration, as compared in FIGS. 7C and 8C.

Figure 7D:
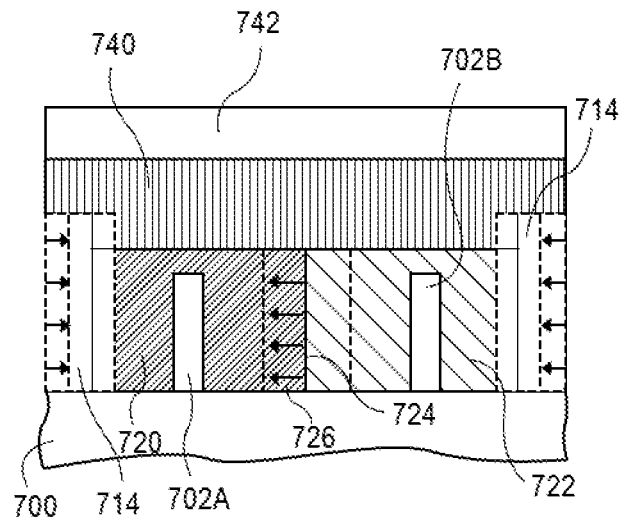

Referring to FIG. 7D, the dummy gate electrode 712 of FIG. 7C is replaced with permanent gate electrodes. In the case of use of a dummy gate dielectric layer, such a dummy gate dielectric layer may also be replaced by a permanent gate dielectric layer in this process. In the specific example shown, a dual metal gate replacement process is performed to provide an N-type gate electrode 720 over a first semiconductor fin 702A and to provide a P-type gate electrode 722 over a second semiconductor fin 702B. The N-type gate electrode 720 and the P-type gate electrode 722 are formed between the gate endcap isolations structures 714, but form a P/N junction 724 where they meet. The exact location of the P/N junction 724 may vary, depending on mis-registration, as depicted by the arrowed region 726.

Figure 8C:
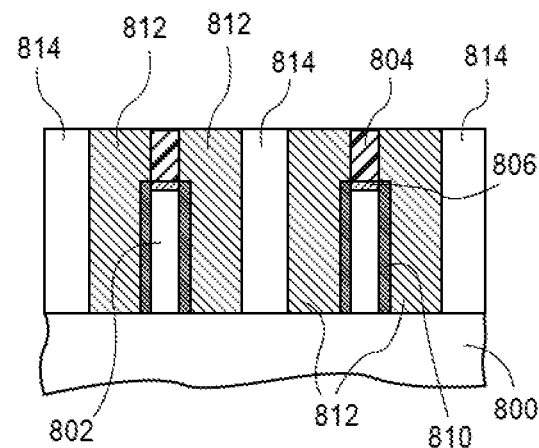
Figure 8D:
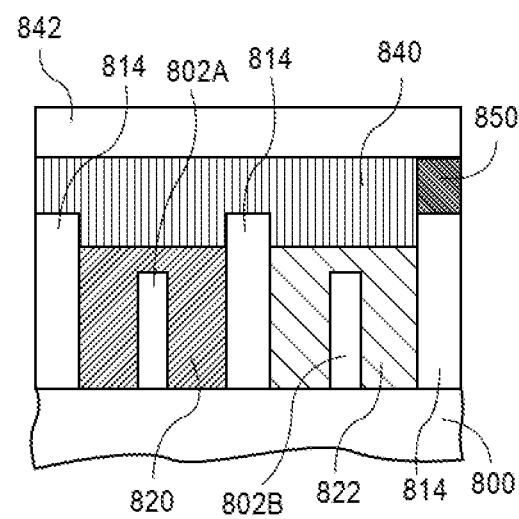

By contrast, referring to FIG. 8D, the hardmask layer 804 and pad oxide layer 806 are removed, and the dummy spacers 814 of FIG. 8C are replaced with permanent gate electrodes. In the case of use of a dummy gate dielectric layer, such a dummy gate dielectric layer may also be replaced by a permanent gate dielectric layer in this process. In the specific example shown, a dual metal gate replacement process is performed to provide an N-type gate electrode 820 over a first semiconductor fin 802A and to provide a P-type gate electrode 822 over a second semiconductor fin 802B. The N-type gate electrode 820 and the P-type gate electrode 822 are formed between, and are also separated by, the gate endcap isolations structures 814.

Referring again to FIG. 7D, a local interconnect 740 may be fabricated to contact N-type gate electrode 720 and P-type gate electrode 722 to provide a conductive path around the P/N junction 724. Likewise, referring to FIG. 8D, a local interconnect 840 may be fabricated to contact N-type gate electrode 820 and P-type gate electrode 822 to provide a conductive path over the intervening isolation structure 814 there between. Referring to both FIGS. 7D and 8D, a hardmask 742 or 842 may be formed on the local interconnect 740 or 840, respectively. Referring to FIG. 8D in particular, in an embodiment, the continuity of the local interconnect 840 is interrupted by a dielectric plug 850 in cases where a break in electrical contact along a gate line are needed. As used, herein, the term "plug" is used to refer to a non-conductive space or interruption of a metal or otherwise conductive structure, such as an interruption of a local interconnect feature. However, in accordance with one or more embodiments of the present disclosure, a local interconnect is fabricated according to an embodiment described above in association with FIG. 2, 3A-3G, 4 or 5A-5J.

In accordance with one or more embodiments of the present disclosure, a self-aligned gate endcap (SAGE) processing scheme involves the formation of gate/trench contact endcaps self-aligned to fins without requiring an extra length to account for mask mis-registration. Thus, embodiments may be implemented to enable shrinking of transistor layout area. Furthermore, a flexible fin-height (e.g., multi Hsi) process may enable independent optimization of different cells for power and performance. An integrated process flow enabling both features may be implemented to meet scaling and performance challenges for future CMOS technology. Embodiments described herein may involve the fabrication of gate endcap isolation structures, which may also be referred to as gate walls or SAGE walls.

More generally, one or more embodiments described herein provide an avenue for area scaling, reducing capacitance, and/or eliminating various critical front end masks, such as gate cut masks. In one such embodiment the width of a minimum transistor can be reduced by up to 30% by implementing one or more of the approaches describe herein. The smaller transistor size reduces the capacitance between the gate and TCN and other parasitic capacitances. In one embodiment, no extra mask operations are needed to create the endcaps, contacts and local interconnect lines so the many masks needed for such features in the standard process are eliminated.

More specifically, key features of one or more embodiments described above may include one or more of: (1) the gate endcap is the distance from the fin endcap to the isolation endcap. This distance is defined by the spacer width and is the same size for all transistors. No lithographic patterning is needed to define the endcap so there is no need to allow for mask registration in the endcap; (2) The TCN overlap of the fin is determined by the spacer width and is also not affected by mask registration. Embodiments may be applicable to the 7 nm node generation, e.g., to improve transistor layout density and gate capacitance (dynamic energy and performance improvement) and reduce total mask count. It is to be appreciated that the structures resulting from the above exemplary processing schemes may be used in a same or similar form for subsequent processing operations to complete device fabrication, such as PMOS and NMOS device fabrication.

As described throughout the present application, a substrate may be composed of a semiconductor material that can withstand a manufacturing process and in which charge can migrate. In an embodiment, a substrate is described herein is a bulk substrate composed of a crystalline silicon, silicon/germanium or germanium layer doped with a charge carrier, such as but not limited to phosphorus, arsenic, boron or a combination thereof, to form an active region. In one embodiment, the concentration of silicon atoms in such a bulk substrate is greater than 97%. In another embodiment, a bulk substrate is composed of an epitaxial layer grown atop a distinct crystalline substrate, e.g. a silicon epitaxial layer grown atop a boron-doped bulk silicon mono-crystalline substrate. A bulk substrate may alternatively be composed of a group III-V material. In an embodiment, a bulk substrate is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, a bulk substrate is composed of a III-V material and the charge-carrier dopant impurity atoms are ones such as, but not limited to, carbon, silicon, germanium, oxygen, sulfur, selenium or tellurium.

As described throughout the present application, gate lines or gate structures may be composed of a gate electrode stack which includes a gate dielectric layer and a gate electrode layer. In an embodiment, the gate electrode of the gate electrode stack is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of a semiconductor substrate. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In some implementations, a portion of the gate dielectric is a "U"-shaped structure that includes a bottom portion substantially parallel to the surface of the substrate and two sidewall portions that are substantially perpendicular to the top surface of the substrate.

In one embodiment, a gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. The gate electrode layer may consist of a P-type workfunction metal or an N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

As described throughout the present application, spacers associated with gate lines or electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

As described throughout the present application, isolation regions such as shallow trench isolation regions or sub-fin isolation regions may be composed of a material suitable to ultimately electrically isolate, or contribute to the isolation of, portions of a permanent gate structure from an underlying bulk substrate or to isolate active regions formed within an underlying bulk substrate, such as isolating fin active regions. For example, in one embodiment, an isolation region is composed of one or more layers of a dielectric material such as, but not limited to, silicon dioxide, silicon oxy-nitride, silicon nitride, carbon-doped silicon nitride, or a combination thereof.

In an embodiment, as described throughout, self-aligned gate endcap isolation structures may be composed of a material or materials suitable to ultimately electrically isolate, or contribute to the isolation of, portions of permanent gate structures from one another. Exemplary materials or material combinations include a single material structure such as silicon dioxide, silicon oxy-nitride, silicon nitride, or carbon-doped silicon nitride. Other exemplary materials or material combinations include a multi-layer stack having lower portion silicon dioxide, silicon oxy-nitride, silicon nitride, or carbon-doped silicon nitride and an upper portion higher dielectric constant material such as hafnium oxide. It is to be appreciated that, SAGE walls of varying width may be fabricated, e.g., to provide relatively narrow SAGE walls and relatively wide SAGE walls. It is also to be appreciated that fabrication of gate endcap isolation structures may lead to formation of a seam within the gate endcap isolation structures. It is also to be appreciated that gate endcap isolation structures may differ depending on the spacing of adjacent fins.

In an embodiment, approaches described herein may involve formation of a contact pattern which is very well aligned to an existing gate pattern while eliminating the use of a lithographic operation with exceedingly tight registration budget. In one such embodiment, this approach enables the use of intrinsically highly selective wet etching (e.g., versus dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in other approaches. In an embodiment, a trench contact grid is not separately patterned, but is rather formed between poly (gate) lines. For example, in one such embodiment, a trench contact grid is formed subsequent to gate grating patterning but prior to gate grating cuts.

In some embodiments, the arrangement of a semiconductor structure or device places a gate contact over portions of a gate line or gate stack over isolation regions. However, such an arrangement may be viewed as inefficient use of layout space. In another embodiment, a semiconductor device has contact structures that contact portions of a gate electrode formed over an active region. Thus, contact over active gate (COAG) structures may be fabricated. One or more embodiments of the present disclosure are directed to semiconductor structures or devices having one or more gate contact structures (e.g., as gate contact vias) disposed over active portions of gate electrodes of the semiconductor structures or devices. One or more embodiments of the present disclosure are directed to methods of fabricating semiconductor structures or devices having one or more gate contact structures formed over active portions of gate electrodes of the semiconductor structures or devices. Approaches described herein may be used to reduce a standard cell area by enabling gate contact formation over active gate regions. In one or more embodiments, the gate contact structures fabricated to contact the gate electrodes are self-aligned via structures.

More generally, one or more embodiments are directed to approaches for, and structures formed from, landing a gate contact via directly on an active transistor gate. Such approaches may eliminate the need for extension of a gate line on isolation for contact purposes. Such approaches may also eliminate the need for a separate gate contact (GCN) layer to conduct signals from a gate line or structure. In an embodiment, eliminating the above features is achieved by recessing contact metals in a trench contact (TCN) and introducing an additional dielectric material in the process flow (e.g., TILA). The additional dielectric material is included as a trench contact dielectric cap layer with etch characteristics different from the gate dielectric material cap layer already used for trench contact alignment in a gate aligned contact process (GAP) processing scheme (e.g., GILA). However, in technologies where space and layout constraints are somewhat relaxed compared with current generation space and layout constraints, a contact to gate structure may be fabricated by making contact to a portion of the gate electrode disposed over an isolation region.

Furthermore, a gate stack structure may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials, capping layers, or plugs are composed of dielectric materials different from the interlayer dielectric material. In one embodiment, different hardmask, capping or plug materials may be used in different regions so as to provide different growth or etch selectivity to each other and to the underlying dielectric and metal layers. In some embodiments, a hardmask layer, capping or plug layer includes a layer of a nitride of silicon (e.g., silicon nitride) or a layer of an oxide of silicon, or both, or a combination thereof. Other suitable materials may include carbon-based materials. Other hardmask, capping or plug layers known in the arts may be used depending upon the particular implementation. The hardmask, capping or plug layers maybe formed by CVD, PVD, or by other deposition methods.

In an embodiment, as is also used throughout the present description, lithographic operations are performed using 193 nm immersion litho (i193), EUV and/or EBDW lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

Pitch division processing and patterning schemes may be implemented to enable embodiments described herein or may be included as part of embodiments described herein. Pitch division patterning typically refers to pitch halving, pitch quartering etc. Pitch division schemes may be applicable to FEOL processing, BEOL processing, or both FEOL (device) and BEOL (metallization) processing. In accordance with one or more embodiments described herein, optical lithography is first implemented to print unidirectional lines (e.g., either strictly unidirectional or predominantly unidirectional) in a pre-defined pitch. Pitch division processing is then implemented as a technique to increase line density.

In an embodiment, the term "grating structure" for fins, gate lines, metal lines, ILD lines or hardmask lines is used herein to refer to a tight pitch grating structure. In one such embodiment, the tight pitch is not achievable directly through a selected lithography. For example, a pattern based on a selected lithography may first be formed, but the pitch may be halved by the use of spacer mask patterning, as is known in the art. Even further, the original pitch may be quartered by a second round of spacer mask patterning. Accordingly, the grating-like patterns described herein may have metal lines, ILD lines or hardmask lines spaced at a substantially consistent pitch and having a substantially consistent width. For example, in some embodiments the pitch variation would be within ten percent and the width variation would be within ten percent, and in some embodiments, the pitch variation would be within five percent and the width variation would be within five percent. The pattern may be fabricated by a pitch halving or pitch quartering, or other pitch division, approach. In an embodiment, the grating is not necessarily single pitch.

It is to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, or a FIN-FET. One or more embodiments may be particularly useful for fabricating semiconductor devices at a 10 nanometer (10 nm) technology node sub-10 nanometer (10 nm) technology node.

Additional or intermediate operations for FEOL layer or structure fabrication (or BEOL layer or structure fabrication) may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, or any other associated action with microelectronic component fabrication. Also, it is to be appreciated that the process operations described for the preceding process flows may be practiced in alternative sequences, not every operation need be performed or additional process operations may be performed, or both.

In an embodiment, as described throughout, an integrated circuit structure includes non-planar devices such as, but not limited to, a finFET or a tri-gate device. The non-planar devices may further include corresponding one or more overlying nanowire structures above the finFET or a tri-gate device. In such an embodiment, a corresponding semiconducting channel region is composed of or is formed in a three-dimensional body with one or more discrete nanowire channel portions overlying the three-dimensional body. In one such embodiment, the gate structures surround at least a top surface and a pair of sidewalls of the three-dimensional body, and further surrounds each of the one or more discrete nanowire channel portions.

Embodiments disclosed herein may be used to manufacture a wide variety of different types of integrated circuits or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 9:
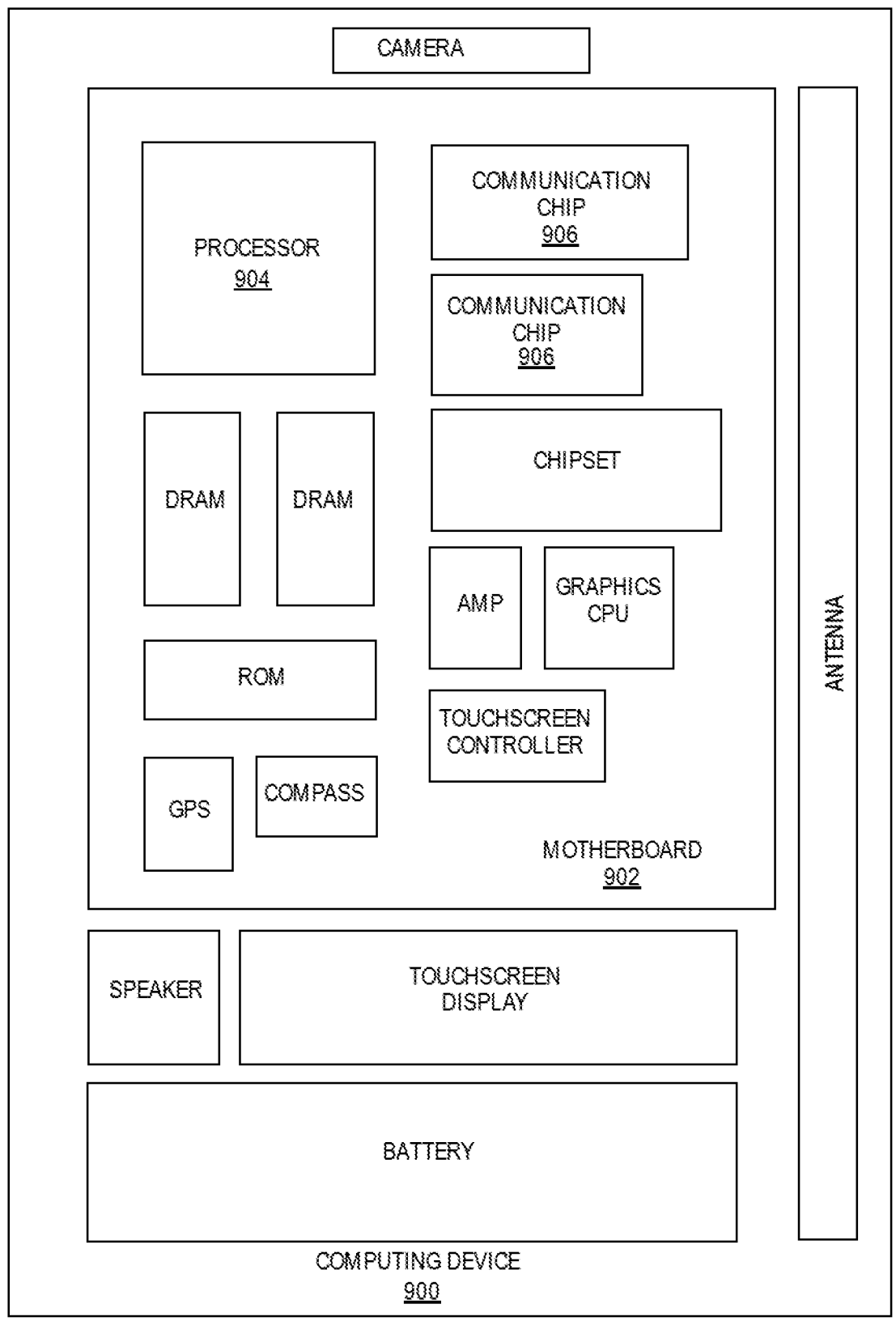
FIG. 9 illustrates a computing device in accordance with one implementation of the disclosure.

FIG. 9 illustrates a computing device 900 in accordance with one implementation of the disclosure. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of embodiments of the disclosure, the integrated circuit die of the processor includes one or more structures, such as integrated circuit structures built in accordance with implementations of the disclosure. The term "processor" may refer to any device or portion of a device that processes electronic data from registers or memory to transform that electronic data, or both, into other electronic data that may be stored in registers or memory, or both.

The communication chip 906 also includes an integrated circuit die packaged within the communication chip 906. In accordance with another implementation of the disclosure, the integrated circuit die of the communication chip is built in accordance with implementations of the disclosure.

In further implementations, another component housed within the computing device 900 may contain an integrated circuit die built in accordance with implementations of embodiments of the disclosure.

In various embodiments, the computing device 900 may be a laptop, a netbook, a notebook, an ultrabook, a smartphone, a tablet, a personal digital assistant (PDA), an ultramobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Figure 10:
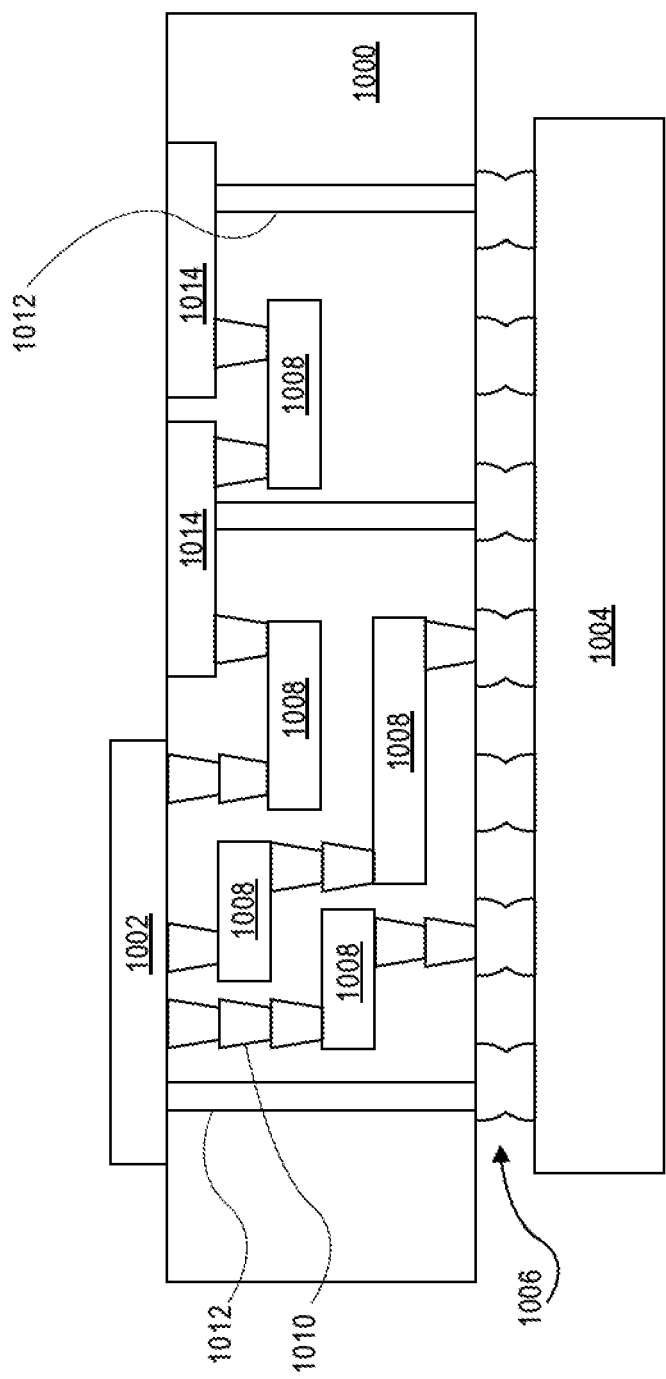
FIG. 10 illustrates an interposer that includes one or more embodiments of the disclosure.

FIG. 10 illustrates an interposer 1000 that includes one or more embodiments of the disclosure. The interposer 1000 is an intervening substrate used to bridge a first substrate 1002 to a second substrate 1004. The first substrate 1002 may be, for instance, an integrated circuit die. The second substrate 1004 may be, for instance, a memory module, a computer motherboard, or another integrated circuit die. Generally, the purpose of an interposer 1000 is to spread a connection to a wider pitch or to reroute a connection to a different connection. For example, an interposer 1000 may couple an integrated circuit die to a ball grid array (BGA) 1006 that can subsequently be coupled to the second substrate 1004. In some embodiments, the first and second substrates 1002/1004 are attached to opposing sides of the interposer 1000. In other embodiments, the first and second substrates 1002/1004 are attached to the same side of the interposer 1000. And in further embodiments, three or more substrates are interconnected by way of the interposer 1000.

The interposer 1000 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1008 and vias 1010, including but not limited to through-silicon vias (TSVs) 1012. The interposer 1000 may further include embedded devices 1014, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1000. In accordance with embodiments of the disclosure, apparatuses or processes disclosed herein may be used in the fabrication of interposer 1000 or in the fabrication of components included in the interposer 1000.

Figure 11:
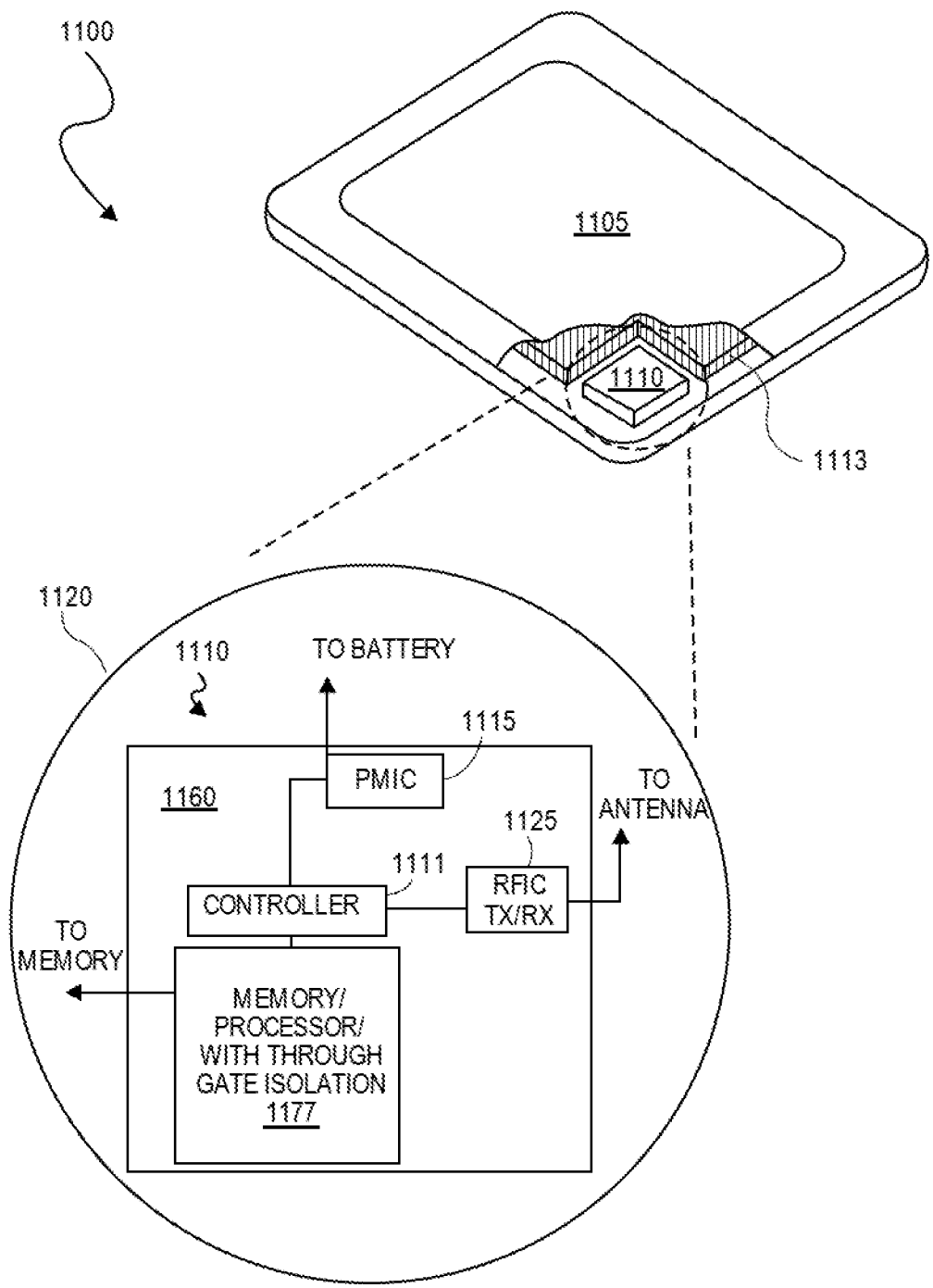
FIG. 11 is an isometric view of a mobile computing platform employing an IC fabricated according to one or more processes described herein or including one or more features described herein, in accordance with an embodiment of the present disclosure.

FIG. 11 is an isometric view of a mobile computing platform 1100 employing an integrated circuit (IC) fabricated according to one or more processes described herein or including one or more features described herein, in accordance with an embodiment of the present disclosure.

The mobile computing platform 1100 may be any portable device configured for each of electronic data display, electronic data processing, and wireless electronic data transmission. For example, mobile computing platform 1100 may be any of a tablet, a smart phone, laptop computer, etc. and includes a display screen 1105 which in the exemplary embodiment is a touchscreen (capacitive, inductive, resistive, etc.), a chip-level (SoC) or package-level integrated system 1110, and a battery 1113. As illustrated, the greater the level of integration in the system 1110 enabled by higher transistor packing density, the greater the portion of the mobile computing platform 1100 that may be occupied by the battery 1113 or non-volatile storage, such as a solid state drive, or the greater the transistor gate count for improved platform functionality. Similarly, the greater the carrier mobility of each transistor in the system 1110, the greater the functionality. As such, techniques described herein may enable performance and form factor improvements in the mobile computing platform 1100.

The integrated system 1110 is further illustrated in the expanded view 1120. In the exemplary embodiment, packaged device 1177 includes at least one memory chip (e.g., RAM), or at least one processor chip (e.g., a multi-core microprocessor and/or graphics processor) fabricated according to one or more processes described herein or including one or more features described herein. The packaged device 1177 is further coupled to the board 1160 along with one or more of a power management integrated circuit (PMIC) 1115, RF (wireless) integrated circuit (RFIC) 1125 including a wideband RF (wireless) transmitter and/or receiver (e.g., including a digital baseband and an analog front end module further including a power amplifier on a transmit path and a low noise amplifier on a receive path), and a controller thereof 1111. Functionally, the PMIC 1115 performs battery power regulation, DC-to-DC conversion, etc., and so has an input coupled to the battery 1113 and with an output providing a current supply to all the other functional modules. As further illustrated, in the exemplary embodiment, the RFIC 1125 has an output coupled to an antenna to provide to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the packaged device 1177 or within a single IC (SoC) coupled to the package substrate of the packaged device 1177.

In another aspect, semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. Furthermore, the demand for higher performance devices results in a need for an improved semiconductor package that enables a thin packaging profile and low overall warpage compatible with subsequent assembly processing.

In an embodiment, wire bonding to a ceramic or organic package substrate is used. In another embodiment, a C4 process is used to mount a die to a ceramic or organic package substrate. In particular, C4 solder ball connections can be implemented to provide flip chip interconnections between semiconductor devices and substrates. A flip chip or Controlled Collapse Chip Connection (C4) is a type of mounting used for semiconductor devices, such as integrated circuit (IC) chips, MEMS or components, which utilizes solder bumps instead of wire bonds. The solder bumps are deposited on the C4 pads, located on the top side of the substrate package. In order to mount the semiconductor device to the substrate, it is flipped over with the active side facing down on the mounting area. The solder bumps are used to connect the semiconductor device directly to the substrate.

Figure 12:
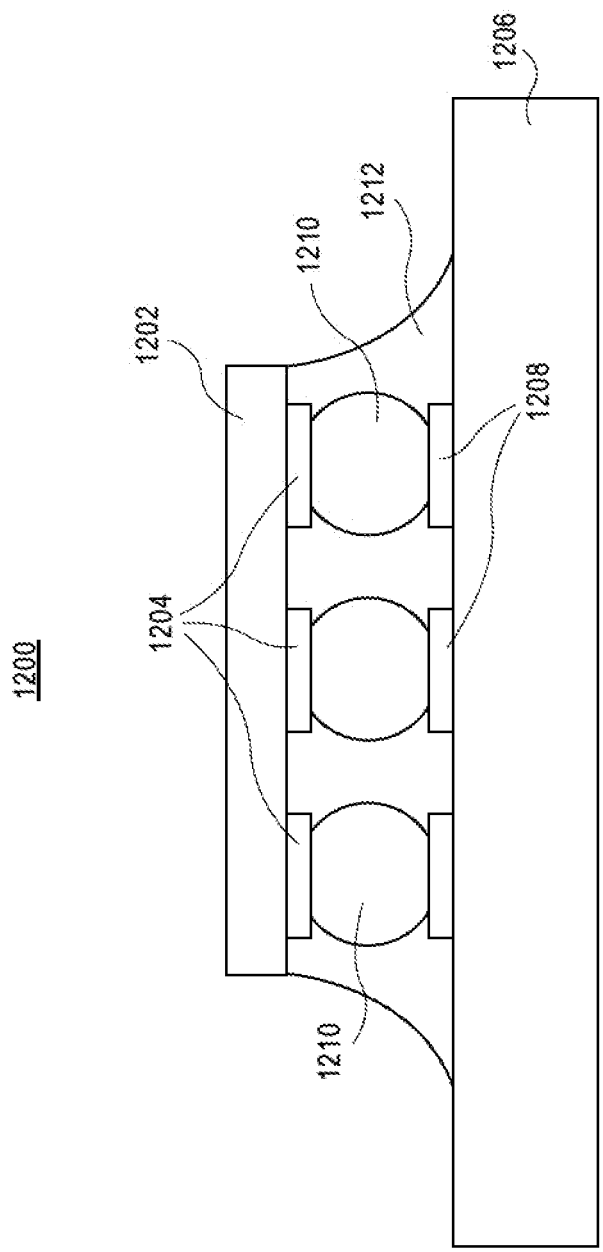
FIG. 12 illustrates a cross-sectional view of a flip-chip mounted die, in accordance with an embodiment of the present disclosure.

FIG. 12 illustrates a cross-sectional view of a flip-chip mounted die, in accordance with an embodiment of the present disclosure.

Referring to FIG. 12, an apparatus 1200 includes a die 1202 such as an integrated circuit (IC) fabricated according to one or more processes described herein or including one or more features described herein, in accordance with an embodiment of the present disclosure. The die 1202 includes metallized pads 1204 thereon. A package substrate 1206, such as a ceramic or organic substrate, includes connections 1208 thereon. The die 1202 and package substrate 1206 are electrically connected by solder balls 1210 coupled to the metallized pads 1204 and the connections 1208. An underfill material 1212 surrounds the solder balls 1210.

Processing a flip chip may be similar to conventional IC fabrication, with a few additional operations. Near the end of the manufacturing process, the attachment pads are metalized to make them more receptive to solder. This typically consists of several treatments. A small dot of solder is then deposited on each metalized pad. The chips are then cut out of the wafer as normal. To attach the flip chip into a circuit, the chip is inverted to bring the solder dots down onto connectors on the underlying electronics or circuit board. The solder is then re-melted to produce an electrical connection, typically using an ultrasonic or alternatively reflow solder process. This also leaves a small space between the chip's circuitry and the underlying mounting. In most cases an electrically-insulating adhesive is then "underfilled" to provide a stronger mechanical connection, provide a heat bridge, and to ensure the solder joints are not stressed due to differential heating of the chip and the rest of the system.

In other embodiments, newer packaging and die-to-die interconnect approaches, such as through silicon via (TSV) and silicon interposer, are implemented to fabricate high performance Multi-Chip Module (MCM) and System in Package (SiP) incorporating an integrated circuit (IC) fabricated according to one or more processes described herein or including one or more features described herein, in accordance with an embodiment of the present disclosure.

Thus, embodiments of the present disclosure include advanced integrated circuit structure fabrication.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example Embodiment 1

An integrated circuit structure includes a first gate structure over a first semiconductor fin, and a second gate structure over a second semiconductor fin. A gate endcap isolation structure is between the first and second semiconductor fins and laterally between and in contact with the first and second gate structures. A gate plug is over the gate endcap isolation structure and laterally between and in contact with the first and second gate structures. A local gate interconnect is between the gate plug and the gate endcap isolation structure, the local gate interconnect in contact with the first and second gate structures.

Example Embodiment 2

The integrated circuit structure of example embodiment 1, wherein the local gate interconnect is continuous with the first and second gate structures.

Example Embodiment 3

The integrated circuit structure of example embodiment 1 or 2, wherein the first and second gate structures each include a local gate contact, and wherein the local gate interconnect is continuous with the local gate contact of each of the first and second gate structures.

Example Embodiment 4

The integrated circuit structure of example embodiment 1, 2 or 3, wherein the gate plug is vertically misaligned with the gate endcap isolation structure.

Example Embodiment 5

The integrated circuit structure of example embodiment 1, 2 or 3, wherein at least a portion of the gate plug is vertically aligned with the gate endcap isolation structure.

Example Embodiment 6

The integrated circuit structure of example embodiment 1, 2, 3, 4 or 5, wherein the gate plug has a width greater than a width of the gate endcap isolation structure.

Example Embodiment 7

The integrated circuit structure of example embodiment 1, 2, 3, 4 or 5, wherein at least a portion of the gate plug has a width the same as a width of the gate endcap isolation structure.

Example Embodiment 8

The integrated circuit structure of example embodiment 1, 2, 3, 4, 5, 6 or 7, further including a first trench contact structure over the first semiconductor fin, and a second trench contact structure over the second semiconductor fin. The gate endcap isolation structure is laterally between and in contact with the first trench contact structure and the second trench contact structure. A trench contact plug is over the gate endcap isolation structure and laterally between and in contact with the first and second trench contact structures. A local trench contact interconnect is between the trench contact plug and the gate endcap isolation structure, the local trench contact interconnect in contact with the first and second trench contact structures.

Example Embodiment 9

The integrated circuit structure of example embodiment 8, wherein the local trench contact interconnect is continuous with the first and second trench contact structures.

Example Embodiment 10

The integrated circuit structure of example embodiment 8 or 9, wherein the trench contact plug is vertically misaligned with the gate endcap isolation structure.

Example Embodiment 11

The integrated circuit structure of example embodiment 8 or 9, wherein at least a portion of the trench contact plug is vertically aligned with the gate endcap isolation structure.

Example Embodiment 12

The integrated circuit structure of example embodiment 8, 9, 10 or 11, wherein the trench contact plug has a width greater than a width of the gate endcap isolation structure.

Example Embodiment 13

The integrated circuit structure of example embodiment 8, 9, 10 or 11, wherein at least a portion of the trench contact plug has a width the same as a width of the gate endcap isolation structure.

Example Embodiment 14

The integrated circuit structure of example embodiment 1, 2, 3, 4, 5, 6, 7, 8, 9, 10, 11, 12 or 13, wherein the first and second semiconductor fins protrude through a trench isolation region above a substrate, and wherein the gate endcap isolation structure is on the trench isolation region.

Example Embodiment 15

An integrated circuit structure including a first trench contact structure over a first semiconductor fin, and a second trench contact structure over a second semiconductor fin. A gate endcap isolation structure is between the first and second semiconductor fins and laterally between and in contact with the first and second trench contact structures. A trench contact plug is over the gate endcap isolation structure and laterally between and in contact with the first and second trench contact structures. A local trench contact interconnect is between the trench contact plug and the gate endcap isolation structure, the local trench contact interconnect in contact with the first and second trench contact structures.

Example Embodiment 16

The integrated circuit structure of example embodiment 15, wherein the local gate interconnect is continuous with the first and second trench contact structures.

Example Embodiment 17

The integrated circuit structure of example embodiment 15 or 16, wherein the trench contact plug is vertically misaligned with the gate endcap isolation structure.

Example Embodiment 18

The integrated circuit structure of example embodiment 15 or 16, wherein at least a portion of the trench contact plug is vertically aligned with the gate endcap isolation structure.

Example Embodiment 19

The integrated circuit structure of example embodiment 15, 16, 17 or 18, wherein the gate trench contact has a width greater than a width of the gate endcap isolation structure.

Example Embodiment 20

The integrated circuit structure of example embodiment 15, 16, 17 or 18, wherein at least a portion of the trench contact plug has a width the same as a width of the gate endcap isolation structure.

Example Embodiment 21

The integrated circuit structure of example embodiment 15, 16, 17, 18, 19 or 20, wherein the first and second semiconductor fins protrude through a trench isolation region above a substrate, wherein the gate endcap isolation structure is on the trench isolation region.

Example Embodiment 22

An integrated circuit structure includes a semiconductor fin protruding through a trench isolation region above a substrate, the semiconductor fin having a top surface. A first gate structure is over the semiconductor fin and over the trench isolation region. A second gate structure is over the semiconductor fin and over the trench isolation region. A local gate interconnect is on the trench isolation region. The local gate interconnect is in contact with the first and second gate structures, and the local gate interconnect has a top surface below the top surface of the semiconductor fin.

Example Embodiment 23

The integrated circuit structure of example embodiment 22, wherein the local gate interconnect is continuous with the first and second gate structures.

Example Embodiment 24

The integrated circuit structure of example embodiment 22 or 23, wherein the trench isolation region is over a fin stub.

Example Embodiment 25

The integrated circuit structure of example embodiment 22, 23 or 24, wherein the local gate interconnect is in contact with a gate endcap isolation structure.

What is claimed is:

1. An integrated circuit structure, comprising:
   a first gate structure over a first semiconductor fin;
   a second gate structure over a second semiconductor fin;
   a gate endcap isolation structure between the first and second semiconductor fins and laterally between and in contact with the first and second gate structures;
   a dielectric gate plug over the gate endcap isolation structure and laterally between and in contact with the first and second gate structures; and
   a local gate interconnect between the dielectric gate plug and the gate endcap isolation structure, the local gate interconnect in contact with the first and second gate structures, wherein the local gate interconnect has a bottommost surface below a bottommost surface of the dielectric gate plug.

2. The integrated circuit structure of claim 1, wherein the local gate interconnect is continuous with the first and second gate structures.

3. The integrated circuit structure of claim 1, wherein the first and second gate structures each comprise a local gate contact, and wherein the local gate interconnect is continuous with the local gate contact of each of the first and second gate structures.

4. The integrated circuit structure of claim 1, wherein the dielectric gate plug is vertically misaligned with the gate endcap isolation structure.

5. The integrated circuit structure of claim 1, wherein at least a portion of the dielectric gate plug is vertically aligned with the gate endcap isolation structure.

6. The integrated circuit structure of claim 1, wherein the dielectric gate plug has a width greater than a width of the gate endcap isolation structure.

7. The integrated circuit structure of claim 1, wherein at least a portion of the dielectric gate plug has a width the same as a width of the gate endcap isolation structure.

8. The integrated circuit structure of claim 1, further comprising:
   a first trench contact structure over the first semiconductor fin;
   a second trench contact structure over the second semiconductor fin, the gate endcap isolation structure laterally between and in contact with the first trench contact structure and the second trench contact structure;
   a dielectric trench contact plug over the gate endcap isolation structure and laterally between and in contact with the first and second trench contact structures; and
   a local trench contact interconnect between the dielectric trench contact plug and the gate endcap isolation structure, the local trench contact interconnect in contact with the first and second trench contact structures.

9. The integrated circuit structure of claim 8, wherein the local trench contact interconnect is continuous with the first and second trench contact structures.

10. The integrated circuit structure of claim 8, wherein the dielectric trench contact plug is vertically misaligned with the gate endcap isolation structure.

11. The integrated circuit structure of claim 8, wherein at least a portion of the dielectric trench contact plug is vertically aligned with the gate endcap isolation structure.

12. The integrated circuit structure of claim 8, wherein the dielectric trench contact plug has a width greater than a width of the gate endcap isolation structure.

13. The integrated circuit structure of claim 8, wherein at least a portion of the Previously Presented trench contact plug has a width the same as a width of the gate endcap isolation structure.

14. The integrated circuit structure of claim 1, wherein the first and second semiconductor fins protrude through a trench isolation region above a substrate, and wherein the gate endcap isolation structure is on the trench isolation region.

15. An integrated circuit structure, comprising:
- a first trench contact structure over a first semiconductor fin;
- a second trench contact structure over a second semiconductor fin;
- a gate endcap isolation structure between the first and second semiconductor fins and laterally between and in contact with the first and second trench contact structures;
- a dielectric trench contact plug over the gate endcap isolation structure and laterally between and in contact with the first and second trench contact structures; and
- a local trench contact interconnect between the dielectric trench contact plug and the gate endcap isolation structure, the local trench contact interconnect in contact with the first and second trench contact structures, wherein the local trench interconnect has a bottommost surface below a bottommost surface of the dielectric gate plug.

16. The integrated circuit structure of claim 15, wherein the local gate interconnect is continuous with the first and second trench contact structures.

17. The integrated circuit structure of claim 15, wherein the dielectric trench contact plug is vertically misaligned with the gate endcap isolation structure.

18. The integrated circuit structure of claim 15, wherein at least a portion of the dielectric trench contact plug is vertically aligned with the gate endcap isolation structure.

19. The integrated circuit structure of claim 15, wherein the gate trench contact has a width greater than a width of the gate endcap isolation structure.

20. The integrated circuit structure of claim 15, wherein at least a portion of the dielectric trench contact plug has a width the same as a width of the gate endcap isolation structure.

21. The integrated circuit structure of claim 15, wherein the first and second semiconductor fins protrude through a trench isolation region above a substrate, wherein the gate endcap isolation structure is on the trench isolation region.

\* \* \* \* \*